(12) United States Patent
Yamada

(10) Patent No.: US 10,437,153 B2
(45) Date of Patent: Oct. 8, 2019

(54) HEAT TREATMENT METHOD AND HEAT TREATMENT APPARATUS

(71) Applicant: SCREEN Holdings Co., Ltd., Kyoto (JP)

(72) Inventor: Takahiro Yamada, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 6 days.

(21) Appl. No.: 15/521,148

(22) PCT Filed: Oct. 8, 2015

(86) PCT No.: PCT/JP2015/078666
§ 371 (c)(1),
(2) Date: Apr. 21, 2017

(87) PCT Pub. No.: WO2016/063743
PCT Pub. Date: Apr. 28, 2016

(65) Prior Publication Data
US 2017/0336711 A1    Nov. 23, 2017

(30) Foreign Application Priority Data

Oct. 23, 2014 (JP) .................................. 2014-216008
Dec. 16, 2014 (JP) .................................. 2014-253779

(51) Int. Cl.
*F26B 3/30*      (2006.01)
*G03F 7/40*      (2006.01)
*H01L 21/027*    (2006.01)

(52) U.S. Cl.
CPC .............. *G03F 7/40* (2013.01); *H01L 21/027* (2013.01)

(58) Field of Classification Search
None
See application file for complete search history.

(56) References Cited

U.S. PATENT DOCUMENTS 6,534,752 B2 *  3/2003  Camm .............. H01L 21/67115
                                                    219/486
7,183,229 B2    2/2007  Yamanaka ................... 438/795
(Continued)

FOREIGN PATENT DOCUMENTS

JP    S55-148423 A    11/1980
JP    60-145616       8/1985
(Continued)

OTHER PUBLICATIONS

International Search Report dated Jan. 12, 2016 in corresponding PCT International Application No. PCT/JP2015/078666.
(Continued)

*Primary Examiner* — Thor S Campbell
(74) *Attorney, Agent, or Firm* — Ostrolenk Faber LLP

(57) ABSTRACT

A substrate having a surface on which a resist film is formed and that has undergone pattern exposure processing and development processing is conveyed into a chamber and held by a holding plate. The surface of the substrate W held by the holding plate is irradiated with flash light emitted from flash lamps. The spectral distribution of the flash light has a peak in a wavelength range of 200 nm to 300 nm. The spectral distribution of the flash light also shows that the relative intensity at a wavelength of 300 nm is 20% or more higher than that at a wavelength of 500 nm. Since the resist film absorbs ultraviolet rays, the resist film can be selectively heated by irradiating the resist film with flash light that includes a large number of wavelength components in the ultraviolet region.

4 Claims, 15 Drawing Sheets

(56) References Cited

U.S. PATENT DOCUMENTS

| | | | | |
|---|---|---|---|---|
| 8,283,607 | B2* | 10/2012 | Ranish | H01L 21/67248 118/725 |
| 9,202,695 | B2 | 12/2015 | Togo | |
| 2006/0018639 | A1* | 1/2006 | Ramamurthy | H01L 21/67103 392/416 |
| 2006/0291835 | A1 | 12/2006 | Nozaki et al. | 392/416 |
| 2009/0075214 | A1 | 3/2009 | Hirakata et al. | 430/319 |
| 2010/0044799 | A1 | 2/2010 | Kurahashi et al. | 257/369 |
| 2010/0074604 | A1* | 3/2010 | Koelmel | H01L 21/67098 392/408 |
| 2012/0076476 | A1* | 3/2012 | Kusuda | F27B 17/0025 392/416 |
| 2012/0076477 | A1* | 3/2012 | Kuroiwa | F27B 17/0025 392/416 |
| 2013/0078744 | A1 | 3/2013 | Kiyama et al. | 438/5 |
| 2016/0079085 | A1* | 3/2016 | Aoyama | H05B 3/0047 438/530 |

FOREIGN PATENT DOCUMENTS

| | | |
|---|---|---|
| JP | S60-145616 A | 8/1985 |
| JP | 2001-332484 | 11/2001 |
| JP | 2002-299361 A | 10/2002 |
| JP | 2007-005532 | 1/2007 |
| JP | 2011-114052 | 6/2011 |
| JP | 2011-114052 A | 6/2011 |
| JP | 2013-074217 A | 4/2013 |
| JP | 2014-120509 | 6/2014 |
| JP | 2014-220496 | 11/2014 |
| WO | WO 2008/099499 | 8/2008 |

OTHER PUBLICATIONS

Taiwanese Office Action dated Aug. 22, 2016 for counterpart application with partial English translation based on Japanese translation.
Taiwanese Decision to Grant dated Mar. 30, 2017, issued for Taiwanese counterpart application (without English translation).
Notification Concerning Transmittal of International Preliminary Report on Patentability (Chapter I of the Patent Cooperation Treaty) together with its English translation of the Notification of Transmittal of Translation of the International Preliminary Report on Patentability and Written Opinion of the International Searching Authority dated May 4, 2017 in corresponding International Application No. PCT/JP2015/078666.
Office Action dated Jan. 30, 2018 in corresponding Japanese Patent Application No. JP2014-253779 with partial English translation (portions relevant to prior-art based rejections are translated).
Office Action dated Apr. 24, 2018 in counterpart Japanese Patent Application No. JP2014-216008 with partial English translation (portions relevant to prior-art based rejections are translated).

* cited by examiner

F I G. 1
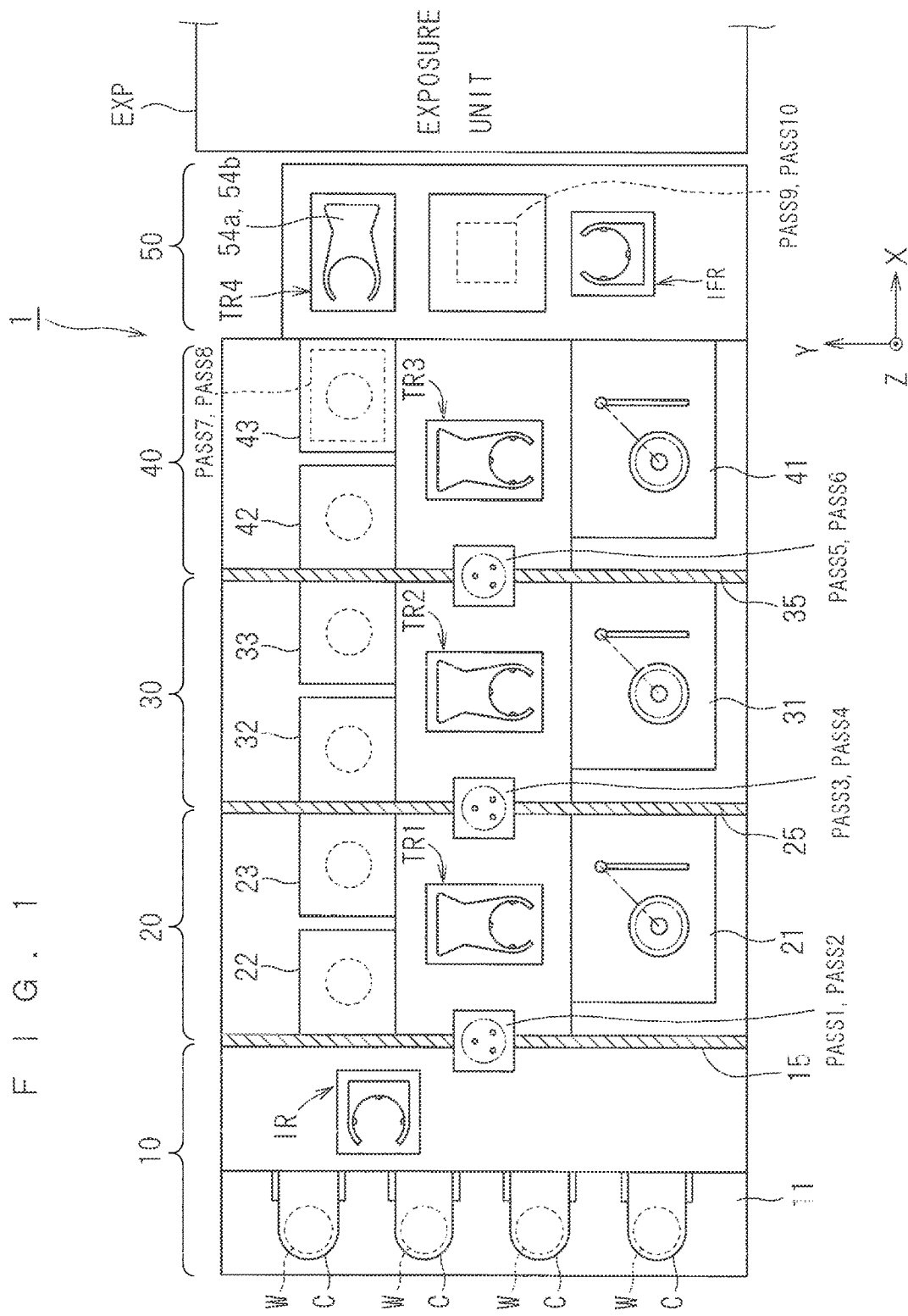

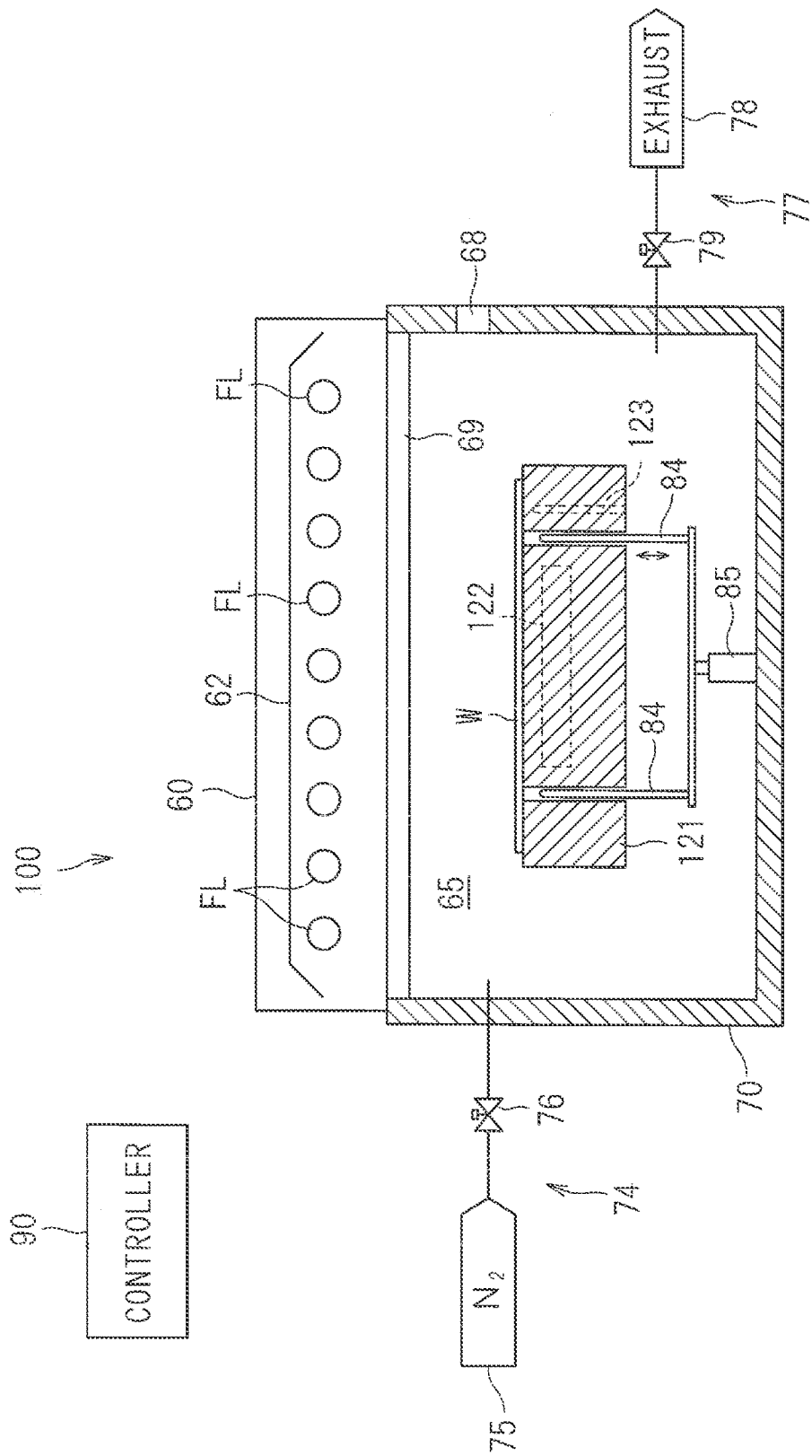

F I G . 1 1
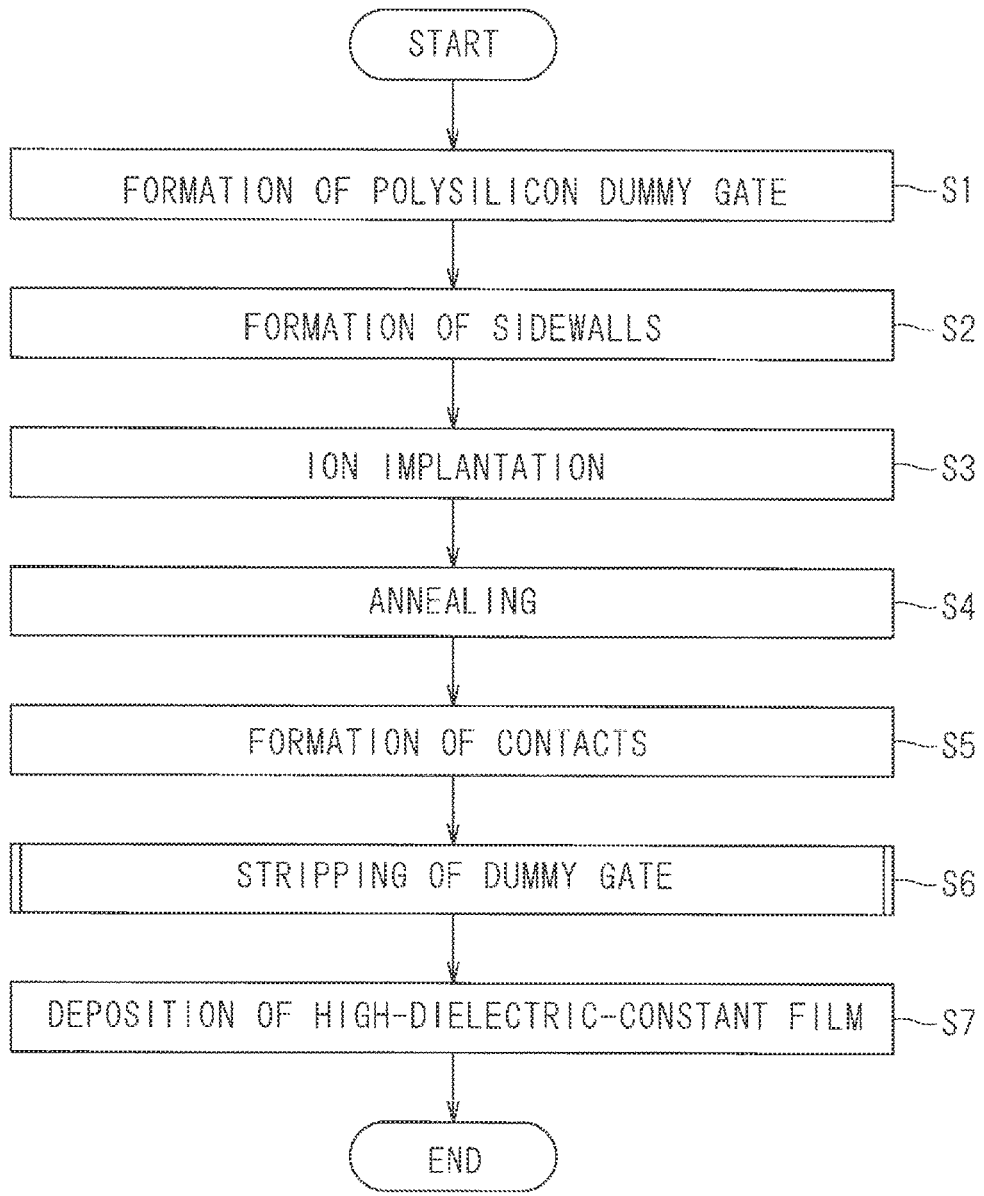

F I G . 1 4
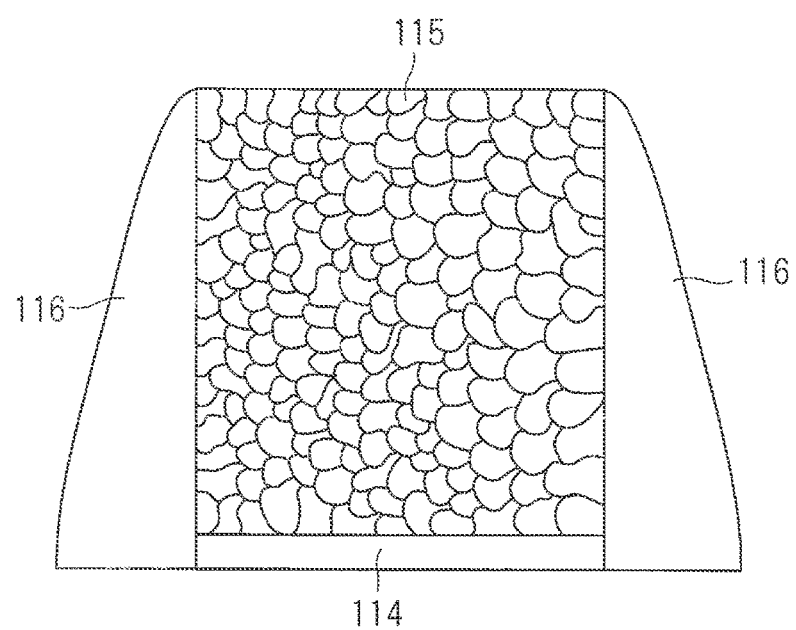

HEAT TREATMENT METHOD AND HEAT TREATMENT APPARATUS

CROSS-REFERENCE TO RELATED APPLICATIONS

The present application is a 35 U.S.C. §§ 371 national phase conversion of PCT/JP2015/078666, filed Oct. 8, 2015, which claims priority to Japanese Patent Application Nos. 2014-216008, filed Oct. 23, 2014 and 2014-253779, filed Dec. 16, 2014, the contents of which are incorporated herein by reference. The PCT International Application was published in the Japanese language.

TECHNICAL FIELD

The present invention relates to a heat treatment method and a heat treatment apparatus for heating sheet precision electronic substrates (hereinafter, simply referred to as "substrates") such as semiconductor wafers and glass substrates for liquid crystal displays by irradiating the substrates with flash light.

BACKGROUND ART

Products such as semiconductor devices and liquid crystal displays are manufactured by performing a series of various types of processing on the aforementioned substrates, such as cleaning, resist coating, exposure, development, etching, formation of an interlayer insulation film, heat treatment, and dicing. Substrate processing apparatuses that perform, among the various types of processing, resist coating processing on substrates and transfer the substrates to an exposure unit, and then perform development processing on the substrates received from the exposure unit after the exposure processing are widely used as so-called "coaters and developers."

Coaters and developers that support exposure units using excimer lasers such as argon fluoride (ArF) or krypton fluoride (KrF) lasers are absolutely required to form a chemically amplified resist film on substrates before transferring the substrates to an exposure unit and perform post-exposure baking processing on the substrates that have undergone exposure. The coaters and developers then form a pattern on the resist film by developing a developer to the substrates that have undergone the post-exposure baking processing and performing development processing on the substrates. At this time, a phenomenon (line width roughness: LWR) in which the line width of the resist pattern that has undergone development is roughened may occur due to slight variations in light intensity at the time of exposure or unevenness of the resist material. In view of this, Patent Literature 1 discloses a technique for selectively heating a surface region of a resist film for reflowing by irradiating a resist pattern that has undergone development with ultraviolet light having a short wavelength of 200 nm or less that can be easily absorbed by the resist material.

Furthermore, development of transistors having gate stacked structures, which are a combination of a high-dielectric-constant gate insulation film (High-k gate insulation film) and a metal gate, has been advancing in recent years for the purpose of considerably reducing leakage current. The gate-first process and the gate-last process are known as methods for manufacturing these transistors. The gate-first process is a process of first forming a gate insulation film and a gate electrode and then forming a source and a drain. This gate-first process is the commonest conventional method for manufacturing transistors.

However, defects are more likely to occur in the high-dielectric-constant gate insulation film when the gate-first process is applied to a transistor including the high-dielectric-constant gate insulation film, because relatively high-temperature heat treatment for forming the source and the drain is performed after the formation of the high-dielectric-constant gate insulation film and the metal gate. Accordingly, consideration is being given to adopting the gate-last process in which the gate insulation film and the gate electrode are formed at the end of the process after the source and the drain are formed.

In the gate-last process, a dummy gate such as polysilicon (polycrystalline silicon) is first formed to form the source and the drain and is then removed (see, for example, Patent Literature 2). Then, a metal gate is formed by embedding a metal material in a groove portion that is generated by the removal of the dummy gate.

The gate-last process has a larger number of processing steps than the gate-first process, but has the merit of suppressing the occurrence of defects in the high-dielectric-constant gate insulation film because high-temperature heat treatment is not performed after the formation of the high-dielectric-constant gate insulation film and the metal gate.

PRIOR ART DOCUMENTS

Patent Literatures

Patent Literature 1: Japanese Patent Application Laid-Open No. 2001-332484
Patent Literature 2: Japanese Patent Application Laid-Open No. 2014-220496

SUMMARY OF INVENTION

Problems to be Solved by Invention

In actuality, however, it is difficult to emit so-called far ultraviolet rays having wavelengths of 200 nm or less, as disclosed in Patent Literature 1, from lamps and heat the resist film with the rays, and even if possible, it would require considerable cost for the lamps.

Besides, the conventional gate-last process has a problem in that the dummy gate of silicon cannot be removed easily and may not be removed sufficiently after the formation of the source and the drain.

The present invention has been conceived in light of the aforementioned problems, and a first object of the present invention is to provide a heat treatment method and a heat treatment apparatus that can selectively heat a resist film while suppressing a considerable increase in cost.

A second object of the present invention is to provide a heat treatment method that can remove a dummy gate with high precision.

Means for Solving Problems

To achieve the aforementioned first object, a first aspect of the present invention is a heat treatment apparatus for applying flash light to a substrate having a surface on which a resist film is formed and that has undergone exposure processing and development processing, to heat the resist film. The apparatus includes a chamber that houses the substrate that has undergone exposure processing, and a flash lamp that irradiates the surface of the substrate housed in the chamber with flash light having a spectral distribution that has a peak in a wavelength range of 200 nm to 300 nm.

A second aspect is a heat treatment apparatus for applying flash light to a substrate having a surface on which a resist film is formed and that has undergone exposure processing and development processing, to heat the resist film. The apparatus includes a chamber that houses the substrate that has undergone exposure processing, and a flash lamp that irradiates the surface of the substrate housed in the chamber with flash light having a spectral distribution showing that a relative intensity at a wavelength of 300 nm is 20% or more higher than a relative intensity at a wavelength of 500 nm.

A third aspect is a heat treatment method for applying flash light to a substrate having a surface on which a resist film is formed and that has undergone exposure processing and development processing, to heat the resist film. The method includes a housing step of housing the substrate that has undergone exposure processing in a chamber, and a flash irradiation step of irradiating the surface of the substrate housed in the chamber with flash light having a spectral distribution that has a peak in a wavelength range of 200 nm to 300 nm.

A fourth aspect is a heat treatment method for applying flash light to a substrate having a surface on which a resist film is formed and that has undergone exposure processing and development processing, to heat the resist film. The method includes a housing step of housing the substrate that has undergone exposure processing in a chamber, and a flash irradiation step of irradiating the surface of the substrate housed in the chamber with flash light having a spectral distribution showing that a relative intensity at a wavelength of 300 nm is 20% or more higher than a relative intensity at a wavelength of 500 nm.

To achieve the aforementioned second object, a fifth aspect of the present invention is a heat treatment method for applying flash light to a substrate on which a dummy gate of polycrystalline silicon is formed, to heat the dummy gate. The method includes a flash irradiation step of irradiating a surface of the substrate with flash light having a spectral distribution that has a peak in a wavelength range of 200 nm to 300 nm, to cause grain growth of silicon crystal grains of the dummy gate, and a stripping step of stripping the dummy gate by supplying a chemical solution to the surface of the substrate.

A sixth aspect is a heat treatment method for applying flash light to a substrate on which a dummy gate of polycrystalline silicon is formed, to heat the dummy gate. The method includes a flash irradiation step of irradiating a surface of the substrate with flash light having a spectral distribution showing that a relative intensity at a wavelength of 300 nm is 20% or more higher than a relative intensity at a wavelength of 500 nm, to cause grain growth of silicon crystal grains of the dummy gate, and a stripping step of stripping the dummy gate by supplying a chemical solution to the surface of the substrate.

Advantageous Effects of Invention

With the heat treatment apparatus of the first aspect, the resist film can be selectively heated while suppressing a considerable increase in cost, because the surface of the substrate is irradiated with the flash light having a spectral distribution that has a peak in a wavelength range of 200 nm to 300 nm.

With the heat treatment apparatus of the second aspect, the resist film can be selectively heated while suppressing a considerable increase in cost, because the surface of the substrate is irradiated with the flash light having a spectral distribution showing that a relative intensity at a wavelength of 300 nm is 20% or more higher than a relative intensity at a wavelength of 500 nm.

With the heat treatment method of the third aspect, the resist film can be selectively heated while suppressing a considerable increase in cost, because the surface of the substrate is irradiated with the flash light having a spectral distribution that has a peak in a wavelength range of 200 nm to 300 nm.

With the heat treatment method of the fourth aspect, the resist film can be selectively heated while suppressing a considerable increase in cost, because the surface of the substrate is irradiated with the flash light having a spectral distribution showing that a relative intensity at a wavelength of 300 nm is 20% or more higher than a relative intensity at a wavelength of 500 nm.

With the heat treatment methods of the fifth and sixth aspects, the irradiation with the flash light that includes a large number of wavelength components in the ultraviolet region allows the dummy gate of polycrystalline silicon, which has a high absorption coefficient for short-wavelength light, to efficiently absorb the flash light and increase in temperature, thereby causing grain growth of silicon crystal grains and improving the stripping properties of the dummy gate in the stripping step. As a result, the dummy gate can be removed with high precision.

BRIEF DESCRIPTION OF DRAWINGS

FIG. 1 is a plan view of a substrate processing apparatus that incorporates a heat treatment apparatus according to a first embodiment.

FIG. 10 illustrates a configuration of an essential part of the heat treatment apparatus according to the present invention.

FIG. 11 is a flowchart illustrating an overall procedure of processing performed on a substrate in the gate-last process.

FIG. 14 illustrates crystal grains in the dummy gate before flash annealing.

EMBODIMENTS FOR IMPLEMENTING INVENTION

Embodiments of the present invention will now be described in detail with reference to drawings.

First Embodiment

Figure 2:
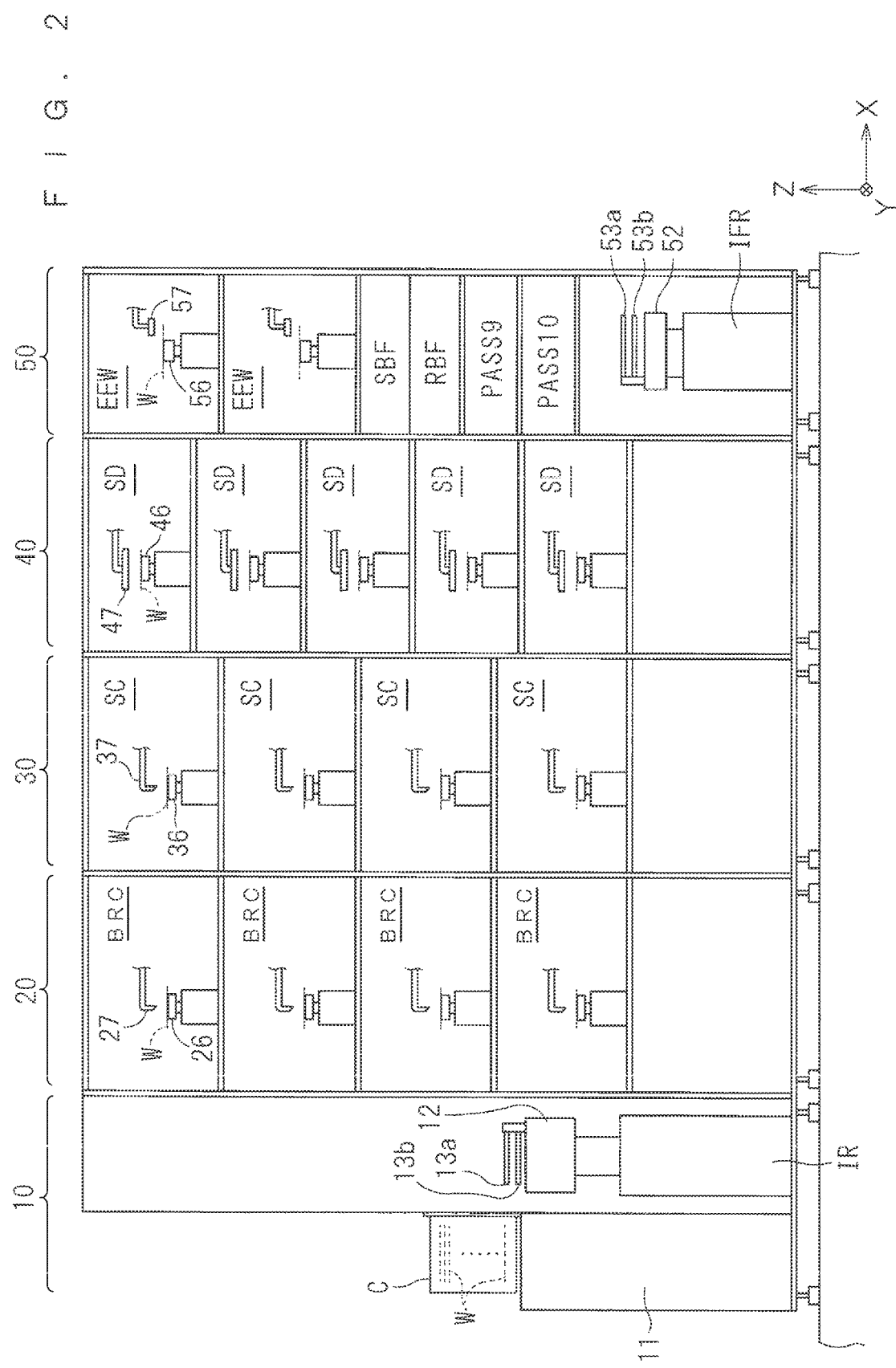
FIG. 2 is a front view of a liquid processing part of the substrate processing apparatus in FIG. 1.
Figure 3:
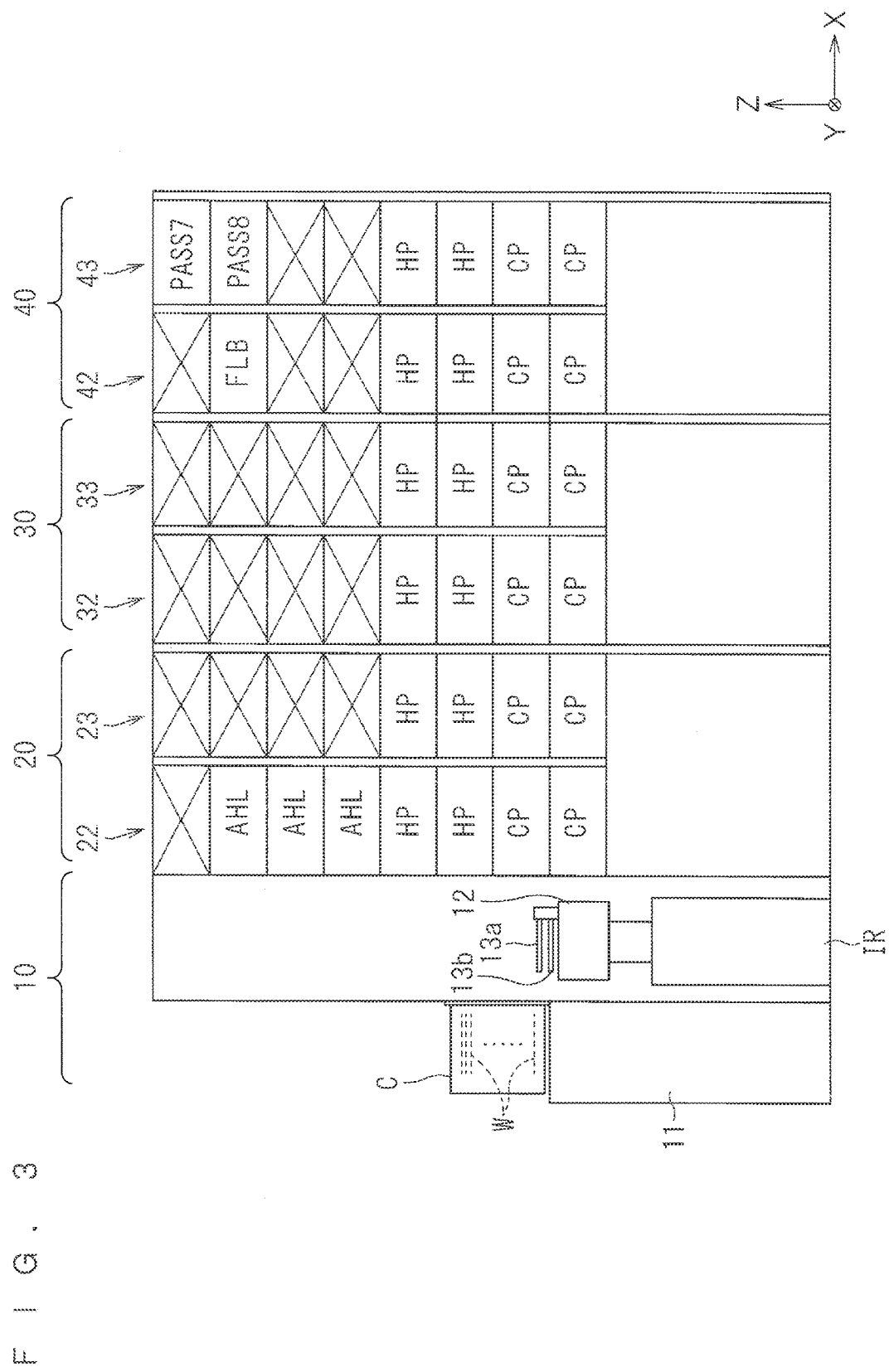
FIG. 3 is a front view of a heat treatment part of the substrate processing apparatus in FIG. 1.
Figure 4:
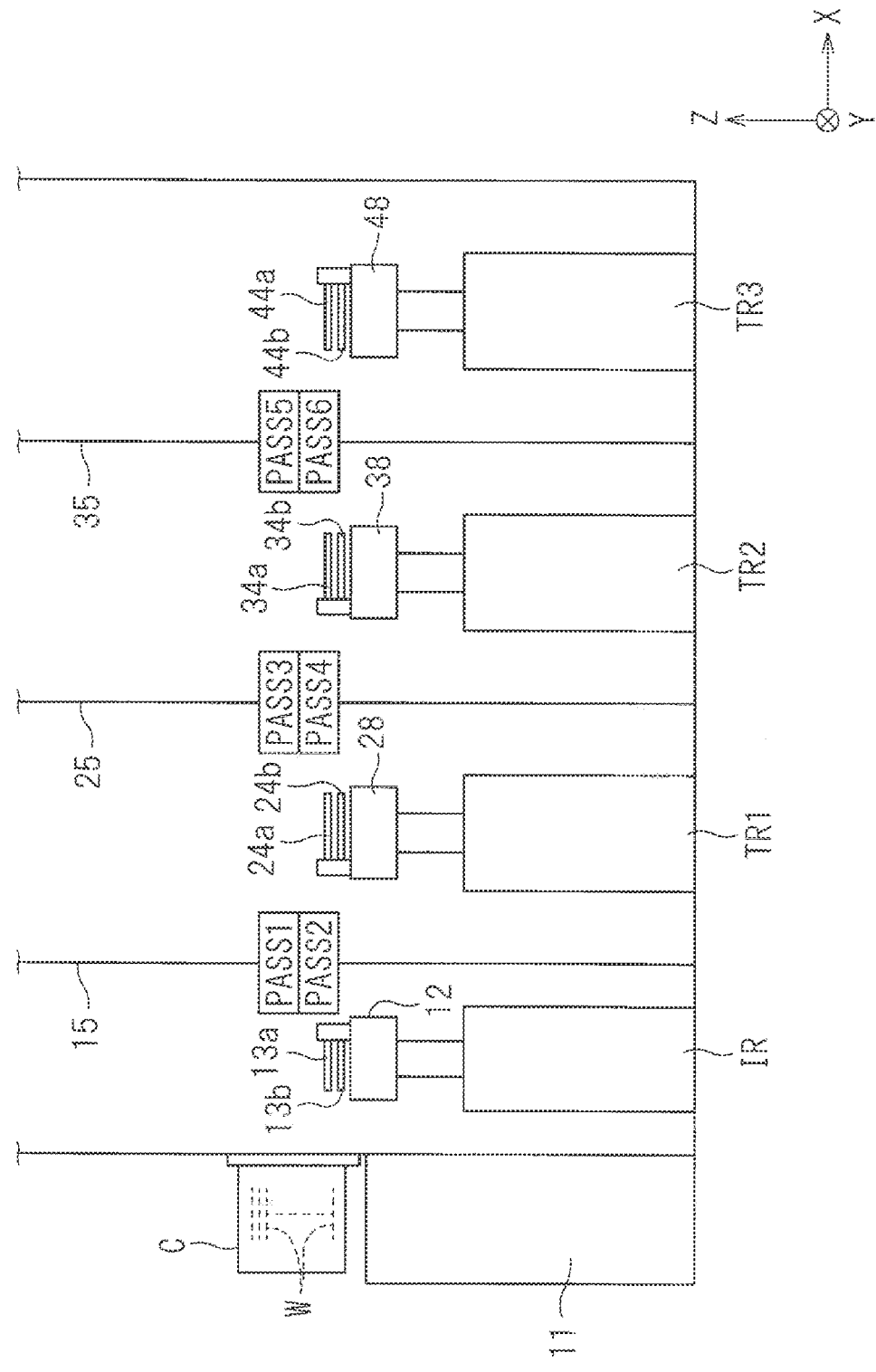
FIG. 4 illustrates the arrangement of transfer robots and substrate placement parts of the substrate processing apparatus in FIG. 1.

First, an overall configuration of a substrate processing apparatus that incorporates a heat treatment apparatus according to the present invention will be described. FIG. 1 is a plan view of a substrate processing apparatus 1 that incorporates a heat treatment apparatus according to a first embodiment. FIG. 2 is a front view of a liquid processing part of the substrate processing apparatus 1, FIG. 3 is a front view of a heat treatment part, and FIG. 4 illustrates the arrangement of transfer robots and substrate placement parts. To define the relation of directions in FIG. 1 and subsequent drawings, an XYZ orthogonal coordinate system is illustrated as appropriate, in which the Z axial direction is assumed to be a vertical direction, and an XY plane is assumed to be a horizontal plane. For easy understanding of the drawings, the dimensions of constituent elements and the number of constituent elements in FIG. 1 and subsequent drawings are exaggerated or simplified as necessary.

The substrate processing apparatus 1 of the first embodiment is an apparatus (so-called coater and developer) that coats substrates W such as semiconductor wafers with a photoresist film and perform development processing on the substrates W that have undergone pattern exposure. The substrates W to be processed by the substrate processing apparatus 1 according to the present invention are not limited to semiconductor wafers, and may be other substrates such as glass substrates for liquid crystal displays or glass substrates for photomasks.

The substrate processing apparatus 1 of the first embodiment is configured by providing five processing blocks that include an indexer block 10, a barking block 20, a resist coating block 30, a development block 40, and an interface block 50 in a row in one direction (X direction). The interface block 50 is connected to an exposure unit (stepper) EXP that is an external device separate from the substrate processing apparatus 1.

The indexer block 10 is a processing block for conveying unprocessed substrates W received from outside the apparatus into the apparatus and conveying processed substrates W that have undergone development processing, out of the apparatus. The indexer block 10 includes a pedestal 11 on which a plurality of (four, in the present embodiment) carriers C are placed side by side, and an indexer robot IR that extracts an unprocessed substrate W from each carrier C and houses a processed substrate W in each carrier C.

The indexer robot IR includes a movable base 12 that is capable of horizontal movements along the pedestal 11 (in the Y axial direction), up and down movements (in the Z axial direction), and rotational movements about an axis extending in the vertical direction. The movable base 12 is equipped with two holding arms 13a and 13b that hold the substrates W in a horizontal position. The holding arms 13a and 13b are slidable and movable back and forth independently of each other. Thus, each of the holding arms 13a and 13b is capable of horizontal movements in the Y axial direction, up and down movements, turning movements in a horizontal plane, and advancing and retracting movements in the direction of the turning radius. The indexer robot IR can thus cause the holding arms 13a and 13b to access each individual carrier C to extract an unprocessed substrate W from the carrier C and house a processed substrate W in the carrier C. The form of the carriers C may be not only a front opening unified pod (FOUP) that houses substrates W in an enclosed space, but also a standard mechanical interface (SMIF) pod or an open cassette (OC) that exposes housed substrates W to outside air.

The barking block 20 is provided adjacent to the indexer block 10. A dividing wall 15 for interception of atmosphere is provided between the indexer block 10 and the barking block 20. This dividing wall 15 is provided with two substrate placement parts PASS1 and PASS2 that are stacked one above the other and that place substrates W thereon for transfer of the substrates W between the indexer block 10 and the barking block 20.

The upper substrate placement part PASS1 is used to convey a substrate W from the indexer block 10 to the barking block 20. The substrate placement part PASS1 has three support pins on which the indexer robot IR of the indexer block 10 places an unprocessed substrate W extracted from a carrier C. Then, a transfer robot TR1 of the barking block 20, which will be described later, receives the substrate W placed on the substrate placement part PASS1. On the other hand, the lower substrate placement part PASS2 is used to convey a substrate W from the barking block 20 to the indexer block 10. The substrate placement part PASS2 also has three support pins on which the transfer robot TR1 of the barking block 20 places a processed substrate W. Then, the indexer robot IR receives the substrate W placed on the substrate placement part PASS2 and houses the substrate W in a carrier C. Substrate placement parts PASS3 to PASS10, which will be described later, also have the same structure as the substrate placement parts PASS1 and PASS2.

The substrate placement parts PASS1 and PASS2 extend through part of the dividing wall 15. The substrate placement parts PASS1 and PASS2 also have an optical sensor (not shown) that detects the presence or absence of a substrate W, and determine, based on a detection signal from the sensor, whether the indexer robot IR or the transfer robot TR1 is capable of transferring a substrate W to and from the substrate placement parts PASS1 and PASS2.

Next, the barking block 20 will be described. The barking block 20 is a processing block for coating a base of a photoresist film with an antireflection film in order to reduce a standing wave or halation that may be generated at the time of exposure. The barking block 20 includes a base coating processing part 21 for coating the surfaces of substrates W with an antireflection film, two heat-treatment towers 22 and 23 for performing heat treatment involved in the coating with the antireflection film, and the transfer robot TR1 that transfers substrates W to and from the base coating processing part 21 and the heat-treatment towers 22 and 23.

In the barking block 20, the base coating processing part 21 and the heat-treatment towers 22 and 23 are arranged facing each other with the transfer robot TR1 sandwiched in between. More specifically, the base coating processing part 21 is located on the front side (−Y side) of the apparatus, and the two heat-treatment towers 22 and 23 are located on the back side (+Y side) of the apparatus. Also, a thermal dividing wall (not shown) is provided on the front side of the heat-treatment towers 22 and 23. The spacing between the base coating processing part 21 and the heat-treatment towers 22 and 23 and the presence of the thermal dividing wall will help avoid the possibility that the heat-treatment towers 22 and 23 will thermally affect the base coating processing part 21.

As illustrated in FIG. 2, the base coating processing part 21 is configured by stacking four coating processing units BRC having similar configurations on top of one another. Each coating processing unit BRC includes, for example, a spin chunk 26 that holds a substrate W by suction in a generally horizontal position and rotates the substrate W in a generally horizontal plane, a coating nozzle 27 that ejects a coating liquid for antireflection film on the substrate W held on the spin chunk 26, a spin motor (not shown) that rotates and drives the spin chunk 26, and a cup (not shown) that surrounds the substrate W held on the spin chunk 26.

As illustrated in FIG. 3, the heat-treatment tower 22 includes two heating units HP that heat substrates W to a predetermined temperature, two cooling units CP that cool the heated substrates W to a predetermined temperature and keep the substrates W at the predetermined temperature, and three adhesion reinforcement processing units AHL that perform heat treatment on the substrates W in a steam atmosphere of hexamethyl disilazane (HMDS) in order to improve the adhesion of the resist film to the substrates W. These units are stacked on top of one another. The heat-treatment tower 23 also includes two heating units HP and two cooling units CP that are stacked on top of one another. The heating units HP and the adhesion reinforcement processing units AHL include a hot plate on which a substrate W is placed and heated, and the cooling units CP include a cooling plate on which a substrate W is placed and cooled. Note that places indicated by X in FIG. 3 are allocated to, for example, piping and wiring, or a reserve free space (the same also applies to the other heat-treatment towers, which will be described later).

As illustrated in FIG. 4, the transfer robot TR1 includes two transfer arms 24a and 24b that are in close proximity in two levels, upper and lower, and hold substrates W in a generally horizontal position. Each of the transfer arms 24a and 24b has a C-shaped end in a plan view and is configured to support the edge of a substrate W from the underside with a plurality of pins that protrude inward from the inner side of the C-shaped arm. The transfer arms 24a and 24b are mounted on a transfer head 28. The transfer head 28 is capable of up and down movements in the vertical direction (Z axial direction) and rotational movements about an axis extending in the vertical direction by a drive mechanism (not shown). The transfer head 28 is also capable of advancing and retracting the transfer arms 24a and 24 independently of each other in the horizontal direction by a sliding mechanism (not shown). Thus, each of the transfer arms 24a and 24b is capable of up and down movements, turning movements in a horizontal plane, and advancing and retracting movements in the direction of the turning radius. Accordingly, the transfer robot TR1 can cause each of the two transfer arms 24a and 24b to independently access the substrate placement parts PASS1 and PASS2, the heat treatment units of the heat-treatment towers 22 and 23 (heating units HP, cooling units CP, and adhesion reinforcement processing unit AHLs) the four coating processing units BRC of the base coating processing part 21, and substrate placement parts PASS3 and PASS4 (described later) and exchange substrates W with these parts.

Next, the resist coating block 30 will be described. The resist coating block 30 is sandwiched between the barking block 20 and the development block 40. A dividing wall 25 for interception of atmosphere is provided between the resist coating block 30 and the barking block 20. The dividing wall 25 is provided with the two substrate placement parts PASS3 and PASS4 that are stacked one above the other and on which substrates W are placed for transfer of the substrates W between the barking block 20 and the resist coating block 30. The substrate placement parts PASS3 and PASS4 have similar configurations to those of the aforementioned substrate placement parts PASS1 and PASS2.

The upper substrate placement part PASS3 is used to convey a substrate W from the barking block 20 to the resist coating block 30. That is, a transfer robot TR2 of the resist coating block 30 receives a substrate W placed on the substrate placement part PASS3 by the transfer robot TR1 of the barking block 20. On the other hand, the lower substrate placement part PASS4 is used to convey a substrate W from the resist coating block 30 to the barking block 20. That is, the transfer robot TR1 of the barking block 20 receives a substrate W placed on the substrate placement part PASS4 by the transfer robot TR2 of the resist coating block 30.

The substrate placement parts PASS3 and PASS4 extend through part of the dividing wall 25. The substrate placement parts PASS3 and PASS4 include an optical sensor (not shown) for detecting the presence or absence of a substrate W, and determines, based on a detection signal from the sensor, whether the transfer robots TR1 and TR2 are capable of transferring substrates W to and from the substrate placement parts PASS3 and PASS4.

The resist coating block 30 is a processing block for forming a resist film by coating substrates W, which are coated with the antireflection film, with a photoresist. In the present embodiment, a chemically amplified resist is used as the photoresist. The resist coating block 30 includes a resist coating processing part 31 that coats the antireflection film, which coats the base, with a resist film, two heat-treatment towers 32 and 33 that perform heat treatment involved in resist coating processing, and the transfer robot TR2 that transfers the substrates W to and from the resist coating processing part 31 and the heat-treatment towers 32 and 33.

In the resist coating block 30, the resist coating processing part 31 and the heat-treatment towers 32 and 33 are arranged facing each other with the transfer robot TR2 sandwiched in between. More specifically, the resist coating processing part 31 is located on the front side of the apparatus, and the two heat-treatment towers 32 and 33 are located on the back side of the apparatus. Also, a thermal dividing wall (not shown) is provided on the front side of the heat-treatment towers 32 and 33. The spacing between the resist coating processing part 31 and the heat-treatment towers 32 and 33 and the presence of the thermal dividing wall will help avoid the possibility that the heat-treatment towers 32 and 33 will thermally affect the resist coating processing part 31.

As illustrated in FIG. 2, the resist coating processing part 31 is configured by stacking four coating processing units SC having similar configurations on top of one another. Each coating processing unit SC includes, for example, a spin chunk 36 that holds a substrate W by suction in a generally horizontal position and rotates the substrate W in a generally horizontal plane, a coating nozzle 37 that ejects a photoresist coating liquid onto the substrate W held on the spin chunk 36, a spin motor (not shown) that rotates and drives the spin chunk 36, and a cup (not shown) that surrounds the substrate W held on the spin chunk 36.

As illustrated in FIG. 3, the heat-treatment tower 32 includes two heating units HP that include a hot plate on which a substrate W is heated to a predetermined temperature, and two cooling units CP that include a cooling plate on which the heated substrates W is cooled to a predetermined temperature and kept at the predetermined temperature. These units are stacked on top of one another. On the other hand, the heat-treatment tower 33 also includes two heating units HP and two cooling units CP that are stacked on top of one another.

As illustrated in FIG. 4, the transfer robot TR2 has a configuration similar to that of the transfer robot TR1 and includes transfer arms 34a and 34b that are located in close proximity in two levels, upper and lower, and hold substrates W in a generally horizontal position. The transfer arms 34a and 34b each support the edge of a substrate W from the underside with a plurality of pins that protrude inward from the inner side of the C-shaped arm. The transfer arms 34a and 34b are mounted on a transfer head 38. The transfer head 38 is capable of up and down movements in the vertical direction (Z axial direction) and rotational movements about an axis extending in the vertical direction by a drive mechanism (not shown). The transfer head 38 is also capable of advancing and retracting the transfer arms 34a and 34b independently of each other in a horizontal direction by a sliding mechanism (not shown). Thus, each of the transfer arms 34a and 34b is capable of up and down movements, turning movements in a horizontal plane, and advancing and retracting movements in the direction of the turning radius. Accordingly, the transfer robot TR2 can cause each of the two transfer arms 34a and 34b to individually access the substrate placement parts PASS3 and PASS4, the heat treatment units of the heat-treatment towers 32 and 33, the four coating processing units SC of the resist coating processing part 31, and substrate placement parts PASS5 and PASS6 (described later) and exchange substrates W with these parts.

Next, the development block 40 will be described. The development block 40 is sandwiched between the resist coating block 30 and the interface block 50. A dividing wall 35 for interception of atmosphere is provided between the development block 40 and the resist coating block 30. This dividing wall 35 is provided with the two substrate placement parts PASS5 and PASS6 that are stacked one above the other and on which substrates W are placed for transfer of the substrates W between the resist coating block 30 and the development block 40. The substrate placement parts PASS5 and PASS6 have configurations similar to those of the aforementioned substrate placement parts PASS1 and PASS2.

The upper substrate placement part PASS5 is used to convey a substrate W from the resist coating block 30 to the development block 40. That is, a transfer robot TR3 of the development block 40 receives a substrate W placed on the substrate placement part PASS5 by the transfer robot TR2 of the resist coating block 30. On the other hand, the lower substrate placement part PASS6 is used to convey a substrate W from the development block 40 to the resist coating block 30. That is, the transfer robot TR2 of the resist coating block 30 receives a substrate W placed on the substrate placement part PASS6 by the transfer robot TR3 of the development block 40.

The substrate placement parts PASS5 and PASS6 extend through part of the dividing wall 35. The substrate placement parts PASS5 and PASS6 include an optical sensor (not shown) that detects the presence or absence of a substrate W, and determines, based on a detection signal from the sensor, whether the transfer robots TR2 and TR3 are capable of transferring substrates W to and from the substrate placement parts PASS5 and PASS6.

The development block 40 is a processing block for performing development processing on substrates W that have undergone exposure processing. The development block 40 includes a development processing part 41 that performs development processing by supplying a developer to substrates W on which a pattern is exposed, a heat-treatment tower 42 that performs heat treatment after the development processing, a heat-treatment tower 43 that performs heat treatment on substrates W immediately after exposure to light, and the transfer robot TR3 that transfers substrates W to and from the development processing part 41 and the heat-treatment tower 42.

As illustrated in FIG. 2, the development processing part 41 is configured by stacking five development processing units SD having similar configurations on top of one another. Each development processing unit SD includes, for example, a spin chunk 46 that holds a substrate by suction in a generally horizontal position and rotates the substrate W in a generally horizontal plane, a nozzle 47 that supplies a developer onto a substrate W held on the spin chunk 46, a spin motor (not shown) that rotates and drives the spin chunk 46, and a cup (not shown) that surrounds the substrate W held on the spin chunk 46.

As illustrated in FIG. 3, the heat-treatment tower 42 includes two heating units HP that include a hot plate on which a substrate W is heated to a predetermined temperature, and two cooling units CP that include a cooling plate on which the heated substrate W is cooled to a predetermined temperature and kept at the predetermined temperature. These units are stacked on top of one another. The heat-treatment tower 42 also includes one flash baking unit FLB that instantaneously heats a substrate W by irradiating the substrate W with flash light. The details of this flash baking unit FLB will be described later. On the other hand, the heat-treatment tower 43 also includes two heating units HP and two cooling units CP stacked on top of one another. The heating units HP of the heat-treatment tower 43 perform post-exposure baking processing on the substrates W immediately after exposure to light. The substrates W are conveyed into and out of the heating units HP and the cooling units CP of the heat-treatment tower 43 by a transfer robot TR4 of the interface block 50.

The heat-treatment tower 43 also incorporates two substrate placement parts PASS7 and PASS8 that are vertically in close proximity to each other and used to transfer substrates W between the development block 40 and the interface block 50. The upper substrate placement part PASS7 is used to convey a substrate W from the development block 40 to the interface block 50. That is, a transfer robot TR4 of the interface block 50 receives a substrate W placed on the substrate placement part PASS7 by the transfer robot TR3 of the development block 40. On the other hand, the lower substrate placement part PASS8 is used to convey a substrate W from the interface block 50 to the development block 40. That is, the transfer robot TR3 of the development block 40 receives a substrate W placed on the substrate placement part PASS8 by the transfer robot TR4 of the interface block 50. Note that the substrate placement parts PASS7 and PASS8 are open to both of the transfer robot TR3 of the development block 40 and the transfer robot TR4 of the interface block 50.

As illustrated in FIG. 4, the transfer robot TR3 includes transfer arms 44a and 44b that are vertically in close proximity to each other and hold substrates W in a generally horizontal position. The transfer arms 44a and 44b each support the edge of a substrate W from the underside with a plurality of pins that protrude inward from the inner side of the C-shaped arm. The transfer arms 44a and 44b are mounted on a transfer head 48. The transfer head 48 is capable of up and down movements in the vertical direction (Z axial direction) and rotational movements about an axis extending in the vertical direction by a drive mechanism (not shown). The transfer head 48 is also capable of advancing and retracting the transfer arms 44a and 44b independently of each other in a horizontal direction by a sliding mechanism (not shown). Thus, each of the transfer arms 44a and 44b is capable of up and down movements, turning movements in a horizontal plane, and advancing and retracting movements in the direction of the turning radius. Accordingly, the transfer robot TR3 can cause each of the two transfer arms 44a and 44b to individually access the substrate placement parts PASS5 and PASS6, the heat treatment units of the heat-treatment tower 42, the five development processing units SD of the development processing part 41, and the substrate placement parts PASS7 and PASS8 of the heat-treatment tower 43 and exchange substrates W with these parts.

Next, the interface block 50 will be described. The interface block 50 is a processing block that is disposed adjacent to the development block 40, transfers unexposed substrates W coated with the resist film to the exposure unit EXP, which is an external apparatus separate from the substrate processing apparatus 1, and receives substrates W that has been exposed to light from the exposure unit EXP and transfers the substrates W to the development block 40. The interface block 50 includes, in addition to a transfer mechanism IFR for transferring substrates W to and from the exposure unit EXP, two edge exposure units EEW that expose peripheral portions of the substrates W coated with the resist film, and the transfer robot TR4 that transfers substrates W to and from the heat-treatment tower 43 of the development block 40 and the edge exposure units EEW.

As illustrated in FIG. 2, the edge exposure units EEW each include, for example, a spin chunk 56 that holds a substrate W by suction in a generally horizontal position and rotates the substrate W in a generally horizontal plane, and a light irradiator 57 that irradiates the edge of a substrate W held on the spin chunk 56 with light to expose the substrate W. The two edge exposure units EEW are stacked one above the other in a central portion of the interface block 50. Under the edge exposure units EEW, a sending buffer SBF for sending substrates, a return buffer RBF for getting substrates back, and two substrate placement parts PASS9 and PASS10 that are stacked on top of one another. The upper substrate placement part PASS9 is used to transfer a substrate W from the transfer robot TR4 to the transfer mechanism IFR, and the lower substrate placement part PASS10 is used to transfer a substrate W from the transfer mechanism IFR to the transfer robot TR4.

The return buffer RBF is used to temporarily house and store substrates W after post-exposure baking performed in the heat-treatment tower 43 of the development block 40, when the development block 40 cannot perform development processing for some troubles on the substrates W that have been exposed to light. On the other hand, the sending buffer SBF is used to temporarily house and store substrates W before exposure processing when the exposure unit EXP cannot accept unexposed substrates W. Both of the return buffer RBF and the sending buffer SBF are configured by storage shelves that can store a plurality of substrates W in multiple stages. Note that the return buffer RBF is accessed by the transfer robot TR4, and the sending buffer SBF is accessed by the transfer mechanism IFR.

The transfer robot TR4 disposed adjacent to the heat-treatment tower 43 of the development block 40 includes transfer arms 54a and 54b that are vertically in close proximity to each other and hold substrates W in a generally horizontal position. The configuration and operating mechanism of the transfer robot TR4 are identical to those of the transfer robots TR1 to TR3. The transfer mechanism IFR includes a movable base 52 that is capable of horizontal movements in the Y axial direction, up and down movements, and rotational movements about an axis extending in the vertical direction, and two holding arms 53a and 53b that hold substrates W in a horizontal position are mounted on the movable base 52. The holding arms 53a and 53b are slidably movable back and forth independently of each other. Thus, the holding arms 53a and 53b are each capable of horizontal movements in the Y axial direction, up and down movements, turning movements in a horizontal plane, and advancing and retracting movement in the direction of the turning radius.

The exposure unit EXP receives substrates W that are coated with the resist by the substrate processing apparatus 1 but not exposed to light yet, from the transfer mechanism IFR and performs pattern exposure processing on the substrates W. The substrates W that have undergo the exposure processing in the exposure unit EXP are received by the transfer mechanism IFR. The exposure unit EXP may support so-called "liquid-immersion exposure processing," i.e., perform exposure processing in a state in which the space between a projection optical system and a substrate W is filled with a liquid having a high refractive index (e.g., deionized water having a refractive index n of 1.44). Alternatively, the exposure unit EXP may perform exposure processing in a vacuum, such as electron beam exposure or extreme ultraviolet (EUV) exposure.

Figure 5:
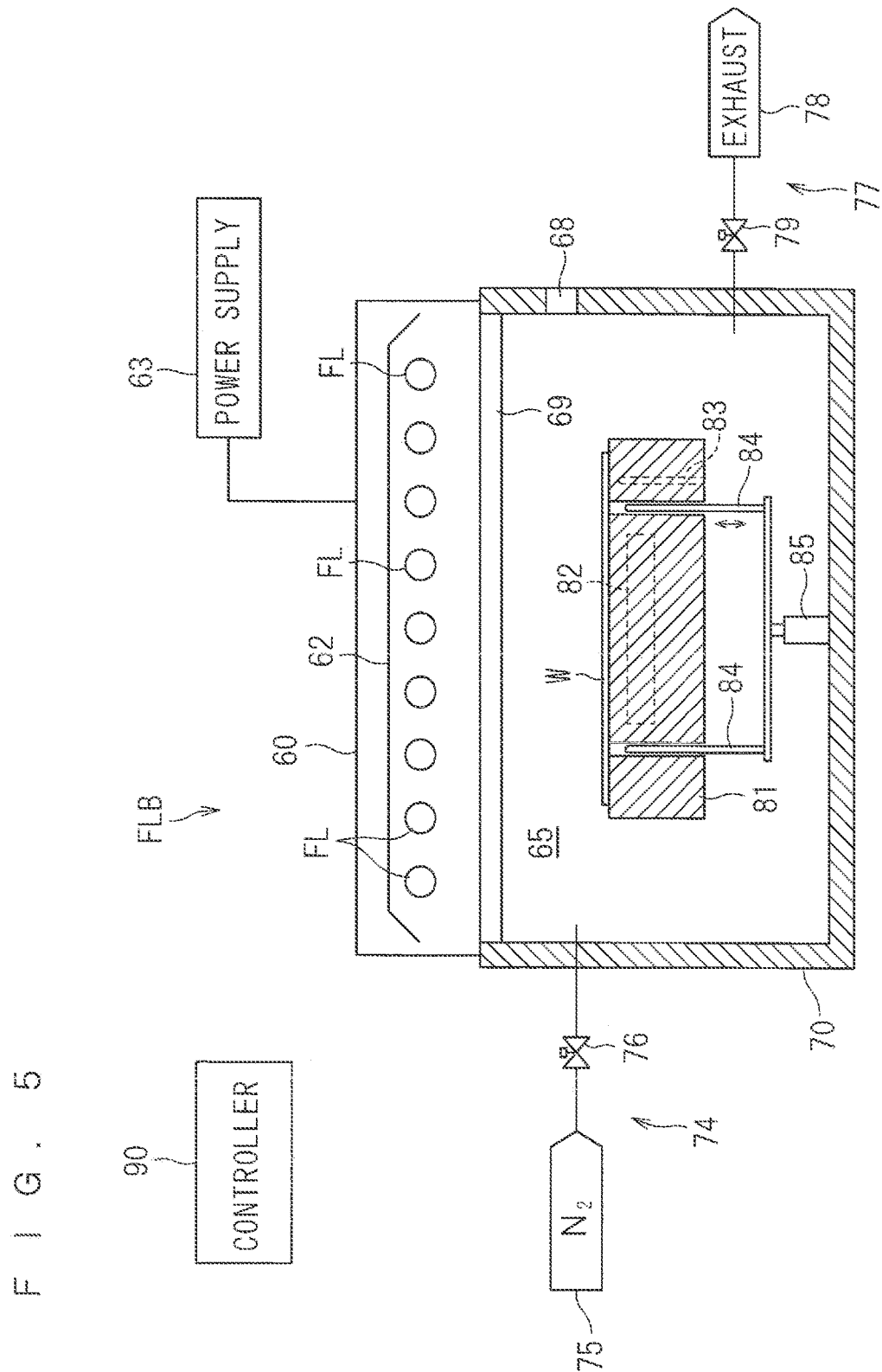
FIG. 5 illustrates a configuration of an essential part of a flash baking unit.

Next, the flash baking unit FLB of the heat-treatment tower 42 will be described. FIG. 5 illustrates a configuration of an essential part of the flash baking unit FLB. The flash baking unit FLB is a heat treatment unit that reshapes the resist film by irradiating substrates W that have undergone exposure processing and development processing with flash light.

The flash baking unit FLB includes a chamber 70 in which a substrate W is housed, a holding plate 81 on which the substrate W is placed and held in the chamber 70, an exhaust part 77 that exhausts gases from the chamber 70, a gas supply part 74 that supplies an inert gas into the chamber 70, and a flash irradiation part 60 that irradiates the substrate W with flash light. The flash baking unit FLB further includes a controller 90 that controls the aforementioned parts and execute post-exposure baking processing.

The chamber 70 is a housing provided below the flash irradiation part 60 and capable of housing the substrate W. The chamber 70 has an upper opening in which a chamber window 69 is mounted to close the opening. The space surrounded by the side and bottom walls of the chamber 70 and the chamber window 69 is defined as a heat treatment space 65. The chamber window 69, which constitutes a ceiling of the chamber 70, is a plate-like member made of synthetic quartz and functions as a quartz window that passes the flash light emitted from the flash irradiation part 60 into the heat treatment space 65. Synthetic quartz has high transmittance even in an ultraviolet region at wavelengths of 300 nm or less.

The side wall of the chamber 70 has a transfer opening 68 for conveying a substrate W into and out of the chamber. The transfer opening 68 can be opened and closed by a shutter (not shown). When the transfer opening 68 is open, the transfer robot TR3 can convey a substrate W into and out of the chamber 70. When the transfer opening 68 is closed, the heat treatment space 65 makes an enclosed space that prevents the circulation of gases into and out of the chamber.

The holding plate 81 is a generally disc-shaped member made of metal (e.g., aluminum) that incorporates a cooling mechanism 82, and places and holds a substrate W in a horizontal position (position at which the direction of the normal to the main surface is along the vertical direction) within the chamber 70. The cooling mechanism 82 may be a water cooling pipe or a Peltier device. The density of arrangement of the cooling mechanism 82 is at least uniform in a region of the holding plate 81 that opposes the substrate W placed on the holding plate 81. The cooling mechanism 82 can thus uniformly cool that region. The cooling temperature of the cooling mechanism 82 is controlled by the controller 90, and in the present embodiment, the cooling temperature is controlled to be kept at 23° C., which is an ordinary temperature in the field of semiconductor manufacturing technology.

The holding plate 81 further includes a temperature sensor 83 configured by a thermocouple. The temperature sensor 83 measures the temperature in the vicinity of the upper surface of the holding plate 81. The result of the measurement by the temperature sensor 83 is transmitted to the controller 90. The controller 90 controls the cooling mechanism 82 such that the temperature of the holding plate 81 measured by the temperature sensor 83 is kept at a preset predetermined temperature (in the present embodiment, 23° C.). That is, the controller 90 performs feedback control of the temperature of the holding plate 81, based on the result of the measurement by the temperature sensor 83. Note that a plurality of temperature sensors 83 may be provided in a region of the holding plate 81 that opposes the substrate W placed on the holding plate 81.

The upper surface of the holding plate 81 has a plurality of (three or more) proximity balls (not shown) arranged thereon. The proximity balls are made of a material such as alumina ($Al_2O_3$) and arranged such that the upper ends of the proximity balls protrude by a slight amount from the upper surface of the holding plate 81. Thus, a slight gap, so-called a proximity gap, is formed between the rear surface of the substrate W and the upper surface of the holding plate 81 when the substrate W is supported by the plurality of proximity balls. Alternatively, a susceptor may be provided on the upper surface of the holding plate 81 to support a substrate W via the susceptor.

The temperature of the substrate W placed on the holding plate 81 via the plurality of proximity balls is adjusted to the ordinary temperature (23° C.) by the holding plate 81. That is, the temperature of the substrate W is cooled to the ordinary temperature if it is higher than the ordinary temperature. The substrate W having a temperature around the ordinary temperature is kept as-is at the ordinary temperature.

The holding plate 81 has a plurality of (three, in the present embodiment) lift pins 84 that appear from the upper surface of the holding plate 81. The height positions of the upper ends of the three lift pins 84 are in the same horizontal plane. The three lift pins 84 are collectively moved up and down in the vertical direction by an air cylinder 85. Each lift pin 84 moves up and down along the inside of a through hole that vertically passes through the holding plate 81. When the air cylinder 85 moves the three lift pins 84 upward, the end of each lift pin 84 protrudes from the upper surface of the holding plate 81. When the air cylinder 85 moves the three lift pins 84 downward, the end of each lift pin 84 enters the inside of the through hole of the holding plate 81.

The gas supply part 74 supplies a nitrogen gas ($N_2$) as an inert gas into the chamber 70. The gas supply part 74 includes a nitrogen supply source 75 and a valve 76 and opens the valve 76 to supply the nitrogen gas into the heat treatment space 65 of the chamber 70. The nitrogen supply source 75 may be configured by, for example, a tank and a feeding pump provided in the substrate processing apparatus 1, or may use utility in a factory where the substrate processing apparatus 1 is installed.

The exhaust part 77 includes an exhaust device 78 and a valve 79 and opens the valve 79 to exhaust an atmosphere in the chamber 70. The exhaust device 78 may be a vacuum pump or an exhaust utility in a factory where the substrate processing apparatus 1 is installed. The atmosphere in the chamber 70 can be reduced to a vacuum atmosphere if a vacuum pump is adopted as the exhaust device 78 and the atmosphere in the heat treatment space 65, which is an enclosed space, is exhausted without supplying any gas from the gas supply part 74. Even if the exhaust device 78 is not a vacuum pump, the atmosphere in the chamber 70 can be reduced to an atmosphere lower than the atmospheric pressure by exhausting the atmosphere without supplying any gas from the gas supply part 74.

The flash irradiation part 60 is provided above the chamber 70. The flash irradiation part 60 includes a light source that includes a plurality of flash lamps FL, and a reflector 62 provided to cover the top of the light source. The flash irradiation part 60 irradiates the substrate W held by the holding plate 81 in the chamber 70 with the flash light emitted from the flash lamps FL through the chamber window 69 made of quartz.

The plurality of flash lamps FL are long cylindrical rod-shaped lamps and arrayed in a plane so that their lengths are parallel to one another along the main surface of the substrate W held by the holding plate 81 (i.e., in the horizontal direction). Thus, the plane formed by the array of the flash lamps FL is also a horizontal plane.

Figure 6:
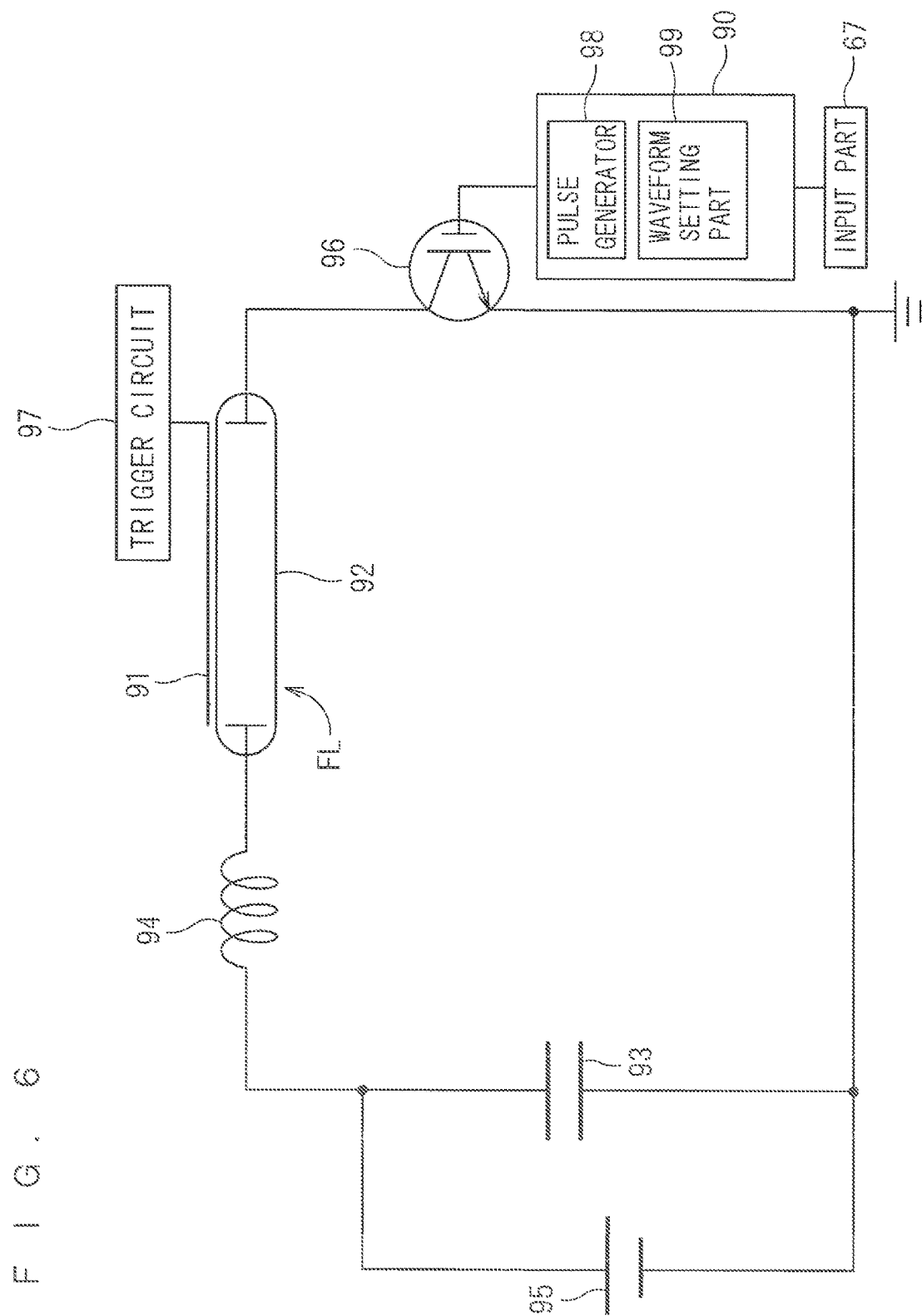
FIG. 6 illustrates a drive circuit of a flash lamp.

FIG. 6 illustrates a drive circuit of a flash lamp FL. As illustrated in FIG. 6, a capacitor 93, a coil 94, a flash lamp FL, and an insulated gate bipolar transistor (IGBT) 96 are connected in series. As illustrated in FIG. 6, the controller 90 includes a pulse generator 98 and a waveform setting part 99 and is connected to an input part 67. The input part 67 may be any of various known input devices such as a keyboard, a mouse, or a touch panel. The waveform setting part 99 sets the waveform of a pulse signal, based on the content of input from the input part 67, and the pulse generator 98 generates a pulse signal in accordance with that waveform.

The flash lamp FL includes a rod-shaped glass tube (discharge tube) 92 that is filled with a xenon gas and has an anode and a cathode at the opposite ends, and a trigger electrode 91 additionally provided on the outer peripheral surface of the glass tube 92. A predetermined voltage is applied from a power supply unit 95 to a capacitor 93, and the capacitor 93 is charged with the amount of charge corresponding to the applied voltage (charging voltage). Also, a high voltage is applied from a trigger circuit 97 to the trigger electrode 91. The timing at which the trigger circuit 97 applies a voltage to the trigger electrode 91 is controlled by the controller 90.

The IGBT 96 is a bipolar transistor that incorporates a metal oxide semiconductor field effect transistor (MOSFET) in the gate part, and is also a switching element that is suited to handle large electric power. A pulse signal is applied from the pulse generator 98 of the controller 90 to the gate of the IGBT 96. When a voltage (high voltage) higher than or equal to a predetermined value is applied to the gate of the IGBT 96, the IGBT 96 is turned on, whereas when a voltage (low voltage) lower than the predetermined value is applied, the IGBT 96 is turned off. In this way, the drive circuit including the flash lamps FL is turned on or off by the IGBT 96. By turning the IGBT 96 on or off, connection to the capacitor 93 corresponding to the flash lamp FL is disconnected.

Even if the IGBT 96 is turned on with the capacitor 93 storing charge and a high voltage is applied across the electrodes in the glass tube 92, no electricity flows through the glass tube 92 in the normal state because the xenon gas is electrically an insulator. However, if an electrical breakdown occurs as a result of the trigger circuit 97 applying a high voltage to the trigger electrode 91, discharge that occurs across the electrodes will produce an instantaneous current flow in the glass tube 92, and light will be emitted by excitation of xenon atoms or molecules at that time.

Figure 7:
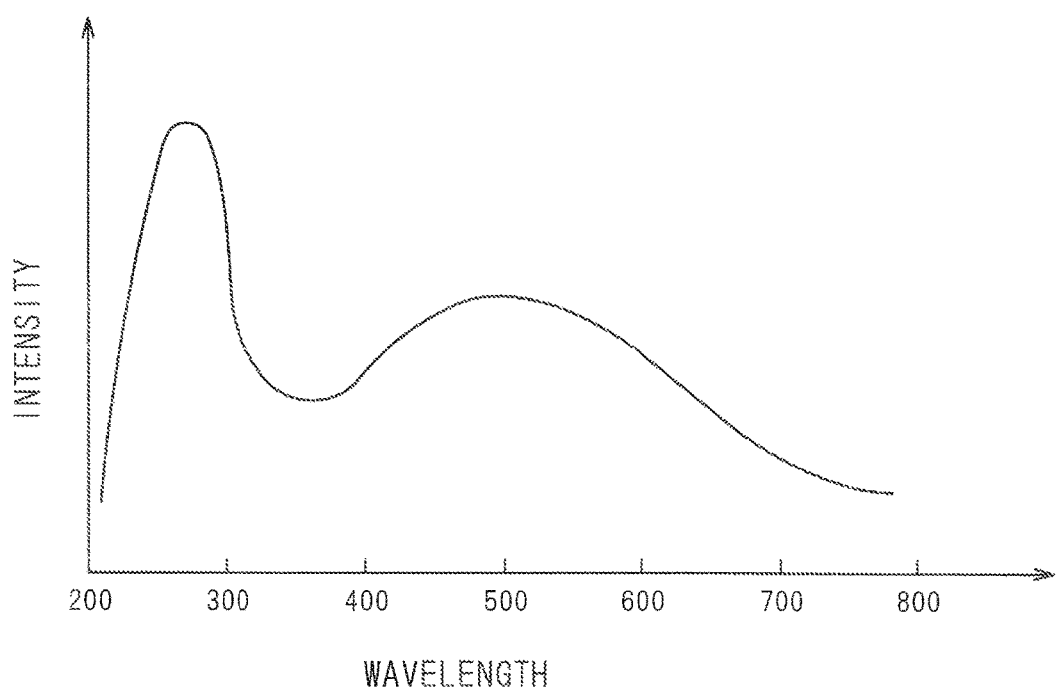
FIG. 7 illustrates a spectral distribution of flash light emitted from the flash lights.

The flash lamps FL in the present embodiment emit flash light that includes a relatively large number of wavelength components in the ultraviolet region. FIG. 7 illustrates a spectral distribution of the flash light emitted from the flash lamps FL. As illustrated in FIG. 7, the spectral distribution of the flash light emitted from the flash lamps FL in the present embodiment has a peak in a wavelength range of 200 nm to 300 nm. The spectral distribution of the flash light emitted from the flash lamps FL also shows that the relative intensity at a wavelength of 300 nm is 20% or more higher than the relative intensity at a wavelength of 500 nm. The spectral distribution as illustrated in FIG. 7 can be obtained by adjusting the components or gas pressure of the xenon gas encapsulated in the glass tube 92. Preferably, the glass tube 92 is also made of synthetic quartz having high transmittance in an ultraviolet region at wavelengths of 300 nm or less.

The reflector 62 is provided above the plurality of flash lamps FL to cover all of the flash lamps FL. A basic function of the reflector 62 is to reflect the flash light emitted from the plurality of flash lamps FL toward the heat treatment space 65. The reflector 62 is made of an aluminum alloy plate and has a surface (surface facing the flash lamps FL) that is roughened by blasting.

The controller 90 controls the aforementioned various operating mechanisms provided in the flash baking unit FLB. The hardware configuration of the controller 90 is similar to that of a generic computer. That is, the controller 90 includes, for example, a CPU that is a circuit for performing various types of computation processing, a read-only memory (ROM) for storing basic programs, a random-access memory (RAM) that is a readable and writable memory for storing various types of information, and a magnetic disk for storing control applications, data, and so on. The processing in the flash baking unit FLB proceeds as a result of the CPU of the controller 90 executing a predetermined processing program. Note that the controller 90 may be provided as a subordinate controller of a main controller that exercises the overall management of the substrate processing apparatus 1.

Next is a description of the procedure of processing performed on substrates by the substrate processing apparatus 1 having the aforementioned configuration. First, an overall procedure of processing performed by the substrate processing apparatus 1 will be described briefly, and then processing performed in the flash baking unit FLB will be described.

Unprocessed substrates W housed in a carrier C are conveyed from the outside of the apparatus into the indexer block 10 by, for example, an automated guided vehicle (AGV). The unprocessed substrates W are then taken out from the indexer block 10. More specifically, the indexer robot IR takes an unprocessed substrate W out of a predetermined carrier C and places the substrate W on the upper substrate placement part PASS1. When the unprocessed substrate W is placed on the substrate placement part PASS1, the transfer robot TR1 of the barking block 20 receives the substrate W and transfers the substrate W to one of the adhesion reinforcement processing units AHL of the heat-treatment tower 22. In the adhesion reinforcement processing unit AHL, heat treatment is performed on the substrate W in a steam atmosphere of HMDS to improve the adhesion properties of the substrate W. The substrate W that has undergone the adhesion reinforcement processing is taken out by the transfer robot TR1 and transferred to and cooled in one of the cooling units CP of the heat-treatment towers 22 and 23.

The cooled substrate W is transferred by the transfer robot TR1 from the cooling unit CP to one of the coating processing units BRC of the base coating processing part 21. In the coating processing unit BRC, a coating liquid for forming an antireflection film is supplied to the surface of the substrate W to coat the surface of the substrate W with the coating liquid by rotation.

After the coating processing ends, the substrate W is transferred by the transfer robot TR1 to one of the heating units HP of the heat-treatment towers 22 and 23. By heating the substrate W in the heating unit HP, the coating liquid is dried and a base antireflection film is fired on the substrate W. Thereafter, the substrate W taken out of the heating unit HP by the transfer robot TR1 is transferred to and cooled in one of the cooling units CP of the heat-treatment towers 22 and 23. The cooled substrate W is placed on the substrate placement part PASS3 by the transfer robot TR1.

When the substrate W with the antireflection film formed thereon is placed on the substrate placement part PASS3, the transfer robot TR2 of the resist coating block 30 receives the substrate W and transfers the substrate W to one of the cooling units CP of the heat-treatment towers 32 and 33 to adjust the temperature of the substrate W to a predetermined temperature. Then, the transfer robot TR2 transfers the temperature-adjusted substrate W to one of the coating processing units SC of the resist coating processing part 31. In the coating processing unit SC, the surface of the substrate W is coated with a coating liquid of photoresist by rotation to form a resist film on the surface of the substrate W. In the present embodiment, a chemically amplified resist is used as the photoresist.

After the resist coating processing ends, the substrate W conveyed out of the coating processing unit SC is transferred by the transfer robot TR2 to one of the heating units HP of the heat-treatment towers 32 and 33. By heating (post-applied baking) the substrate W in the heating unit HP, the coating liquid is dried and a resist film is formed on the substrate W. Thereafter, the substrate W taken out of the heating unit HP by the transfer robot TR2 is transferred to and cooled in one of the cooling units CP of the heat-treatment towers 32 and 33. The cooled substrate W is placed on the substrate placement part PASS5 by the transfer robot TR2.

When the substrate W that has undergone the post-applied baking processing is placed on the substrate placement part PASS5, the transfer robot TR3 of the development block 40 receives the substrate W and places the substrate W as-is on the substrate placement part PASS7. The substrate W placed on the substrate placement part PASS7 is received by the transfer robot TR4 of the interface block 50 and conveyed into one of the upper and lower edge exposure units EEW. In the edge exposure unit EEW, exposure processing (edge exposure processing) is performed on the edge portion of the substrate W. The substrate W that has undergone the edge exposure processing is placed on the substrate placement part PASS9 by the transfer robot TR4. The substrate W placed on the substrate placement part PASS9 is then received by the transfer mechanism IFR, conveyed into the exposure unit EXP, and subjected to pattern exposure processing. Since a chemically amplified resist is used in the present embodiment, acid is generated by photochemical reaction in the exposed portion of the resist film formed on the substrate W.

The substrate W that has undergone the pattern exposure processing and has been exposed to light is returned again from the exposure unit EXP to the interface block 50 and placed on the substrate placement part PASS10 by the transfer mechanism IFR. When the substrate W that has been exposed to light is placed on the substrate placement part PASS10, the transfer robot TR4 receives the substrate W and transfers the substrate W to one of the heating units HP of the heat-treatment tower 43 of the development block 40. In the heating unit HP of the heat-treatment tower 43, post-exposure baking processing is performed to locally change the solubility of the developer in only the exposed portion by advancing a chemical reaction of a resist resin, using a product generated by the photochemical reaction at the time of exposure as an acid catalyst.

The aforementioned chemical reaction is stopped by a mechanism inside the heating unit HP cooling the substrate W that has undergone the post-exposure baking processing. The substrate W is then taken out of the heating unit HP of the heat-treatment tower 43 by the transfer robot TR4 and placed on the substrate placement part PASS8.

When the substrate W is placed on the substrate placement part PASS8, the transfer robot TR3 of the development block 40 receives the substrate W and transfers the substrate W to one of the cooling units CP of the heat-treatment tower 42. In the cooling unit CP, the substrate W that has undergone the post-exposure baking processing is further cooled so that the temperature of the substrate W is accurately adjusted to a predetermined temperature. Thereafter, the transfer robot TR3 takes the substrate W out of the cooling unit CP and transfers the substrate W to one of the development processing units SD of the development processing part 41. In the development processing unit SD, a developer is supplied to the substrate W to advance development processing. After the development processing ends, the substrate W is transferred by the transfer robot TR3 to one of the heating units HP of the heat-treatment tower 42 and is subjected to hard baking (HB) processing for the purpose of completely drying the resist film. Thereafter, the substrate W that has undergone the hard baking processing is taken out of the heating unit HP and transferred to the flash baking unit FLB of the heat-treatment tower 42 by the transfer robot TR3. Although the details will be described later, in the flash baking unit FLB, the resist film is heated and reshaped by applying flash light to the substrate W on which the pattern is formed through the exposure processing and the development processing. The substrate W taken out of the flash baking unit FLB by the transfer robot TR3 is transferred to and cooled in one of the cooling units CP of the heat-treatment tower 42.

Thereafter, the substrate W is taken out of the cooling unit CP and placed on the substrate placement part PASS6 by the transfer robot TR3. The substrate W placed on the substrate placement part PASS6 is then placed as-is on the substrate placement part PASS4 by the transfer robot TR2 of the resist coating block 30. The substrate W placed on the substrate placement part PASS4 is further placed as-is on the substrate placement part PASS2 by the transfer robot TR1 of the barking block 20 and stored in the indexer block 10. The processed substrate W placed on the substrate placement part PASS2 is stored in a predetermined carrier C by the indexer robot IR. Thereafter, the carrier C that stores a predetermined number of processed substrates W is conveyed out of the apparatus. This completes a series of photolithographic processing.

The processing performed in the flash baking unit FLB will be described in more detail. The procedure of the processing performed in the flash baking unit FLB described below proceeds as a result of the controller 90 controlling the operating mechanisms in the flash baking unit FLB.

First, a shutter (not shown) is opened to open the transfer opening 68, and a substrate W that has undergone the hard baking processing is conveyed into the chamber 70 by the transfer robot TR3 of the development block 40. The surface of the substrate W conveyed into the chamber has a resist film patented by the exposure processing and the development processing. This resist film has a thickness of 100 nm or less. The transfer arm 44b (or 44a) of the transfer robot TR3 that holds the substrate W enters the chamber 70 from the transfer opening 68 and stops at a position immediately above the holding plate 81. Then, the three lift pins 84 move upward to receive the substrate W from the transfer arm 44b. Thereafter, the transfer arm 44b of the transfer robot TR3 retracts out of the chamber 70, and the transfer opening 68 is closed so that the heat treatment space 65 in the chamber 70 becomes an enclosed space.

After the transfer arm 44b of the transfer robot TR3 has retracted, the three lift pins 84 supporting the substrate W that has been exposed to light move downward and become embedded in the through holes of the holding plate 81. In the process of moving downward, the lift pins 84 transfer the substrate W to the upper surface of the holding plate 81, and the substrate W is placed and held in a horizontal position on that upper surface.

After the heat treatment space 65 becomes an enclosed space and the substrate W is held by the holding plate 81, flash light is applied from the flash lamps FL of the flash irradiation part 60 to the surface of the substrate W held by the holding plate 81 under the control of the controller 90. At this time, the atmosphere in the chamber 70 may have been replaced by a nitrogen atmosphere by the gas supply part 74 and the exhaust part 77. The temperature of the substrate W held by the holding plate 81 is generally kept at an ordinary temperature.

For the application of flash light from the flash lamps FL, the capacitor 93 is electrically charged in advance by the power supply unit 95. Then, with the capacitor 93 storing the charge, the pulse generator 98 of the controller 90 outputs a pulse signal to the IGBT 96 to drive the IGBT 96 between ON and OFF states.

The waveform of the pulse signal can be defined by inputting, from the input part 67, a set of instructions that sequentially set a time corresponding to the pulse width (ON time) and a time corresponding to the pulse interval (OFF time) as parameters. When an operator inputs such a set of instructions from the input part 67 to the controller 90, the waveform setting part 99 of the controller 90 sets a pulse waveform that repeats ON and OFF in accordance with the set of instructions. Then, the pulse generator 98 outputs a pulse signal in accordance with the pulse waveform, which is set by the waveform setting part 99. As a result, a pulse signal that repeats ON and OFF is applied to the gate of the IGBT 96, and the ON-OFF driving of the IGBT 96 is controlled. More specifically, the IGBT 96 is in the ON state when the pulse signal input to the gate of the IGBT 96 is ON, whereas the IGBT 96 is in the OFF state when the pulse signal is OFF.

In synchronization with the timing at which the pulse signal output from the pulse generator 98 becomes ON, the controller 90 controls the trigger circuit 97 to apply a high voltage (trigger voltage) to the trigger electrode 91. That is, a pulse signal is input to the gate of the IGBT 96 while the capacitor 93 stores the charge, and a high voltage is applied to the trigger electrode 91 in synchronization with the timing at which the pulse signal becomes ON. Thus, when the pulse signal is ON, current always flows across the electrodes in the glass tube 92, and light is emitted by excitation of xenon atoms or molecules at that time.

In this way, the IGBT 96 serving as a switching device is connected to the circuit, and a pulse signal that repeats ON and OFF is output to the gate of the IGBT 96. This allows the IGBT 96 to intermittently continue the supply of charge from the capacitor 93 to the flash lamps FL and to thereby control the amount of current flowing to the flash lamps FL. As a result, the light emission from the flash lamps FL is so-called chopper-controlled, the charge stored in the capacitor 93 is divided for consumption, and the flash lamps FL repeatedly blink within an extremely short period of time. However, the emission output does not become completely zero even during the repeated blinking of the flash lamps FL because the next pulse will be applied to the gate of the IGBT 96 and the current value will increase again before the value of the current flowing to the flash lamps FL becomes completely zero. Accordingly, the flash lamps FL continue to emit light during that period while a pulse signal at a relatively short interval is output to the IGBT 96.

The waveform of the pulse signal may be arbitrarily set by defining the time corresponding to the pulse width and the time corresponding to the pulse interval. Thus, the ON-OFF drive of the IGBT 96 can be controlled arbitrarily, and the light emission time of the flash lamps FL can be adjusted within the range of 0.1 to 1000 milliseconds by appropriately setting the waveform of the pulse signal. Part of the flash light emitted from the flash lamps FL travels directly into the chamber 70, and part of the flash light is once reflected by the reflector 62 and then travels into the chamber 70. Thus, the surface of the substrate W is flash heated by irradiation with such flash light.

Figure 8:
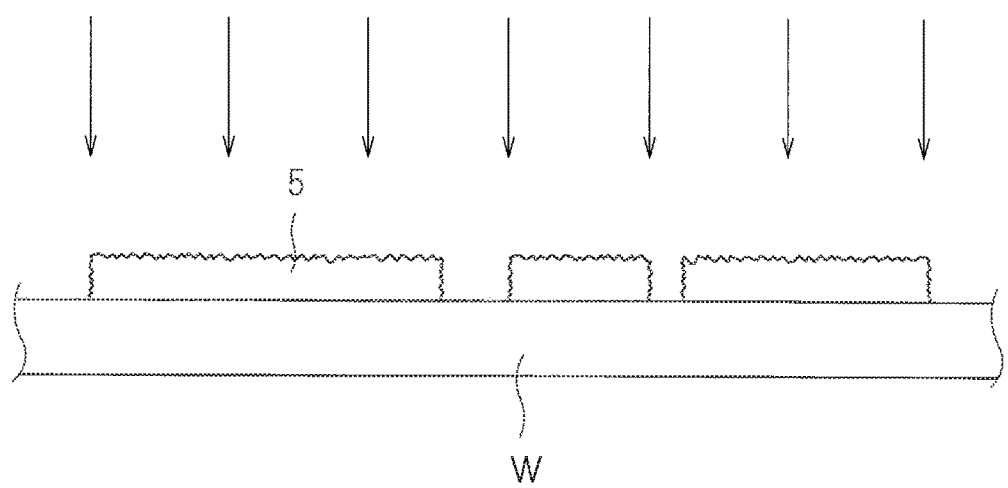
FIG. 8 is a schematic diagram illustrating how the surface of a substrate is heated by irradiation with the flash light.

FIG. 8 is a schematic diagram illustrating how the surface of the substrate W is heated by irradiation with the flash light. The substrate W has a resist film 5 on its surface, and the resist film 5 is patterned by the pattern exposure processing and the development processing described above. Note that a phenomenon (LWR) in which the line width of the pattern is roughened due to slight variations in light intensity at the time of exposure or unevenness of the resist material may occur in the resist film 5 that has undergone the development processing.

Here, as illustrated in FIG. 7, the spectral distribution of the flash light emitted from the flash lamps FL in the present embodiment has a peak in the wavelength range of 200 mm to 300 nm and shows that the relative intensity at a wavelength of 300 nm is 20% or more higher than that at a wavelength of 500 nm. That is, the flash light emitted from the flash lamps FL includes a relatively large number of wavelength components in the ultraviolet region.

The chamber window 69, which functions as a quartz window that passes the flash light, is made of synthetic quartz having high transmittance even in an ultraviolet region at wavelengths of 300 nm or less. Thus, almost all components in the ultraviolet region, included in the flash light emitted from the flash lamps FL, will pass through the chamber window 69, and the surface of the substrate W held by the holding plate 81 in the chamber 70 is irradiated with the flash light having a spectral distribution that has a peak in the wavelength range of 200 nm to 300 nm and shows that the relative intensity at a wavelength of 300 nm is 20% or more higher than that at a wavelength of 500 nm.

The resist film 5 formed on the surface of the substrate W is transparent to visible light, but opaque to ultraviolet rays. That is, the resist film 5 absorbs ultraviolet rays while passing visible light. In the case of conventionally used typical flash lamps, flash light to be emitted primarily includes components in the visible light region. If the substrate W is irradiated with such flash light that primarily includes components in the visible light region, the flash light will pass through the resist film 5 to the substrate W and will be absorbed in the substrate W. As a result, the temperature at the interface between the substrate W and the resist film 5 will increase at the time of irradiation with the flash light, and this heat will be transmitted to the resist film 5 and heat the resist film 5. In this case, device structures or other components already formed on the substrate W may be thermally damaged In the present embodiment, flash light that includes a large number of wavelength components in the ultraviolet region is applied to the surface of the substrate W. Thus, the flash light is absorbed by the resist film 5 without passing through the resist film 5. As a result, although the surface portion of the resist film 5 is directly heated at the time of irradiation with the flash light, the temperature of the substrate W itself will hardly increase. That is, only the surface portion of the resist film 5 is selectively heated by irradiation with the flash light.

Figure 9:
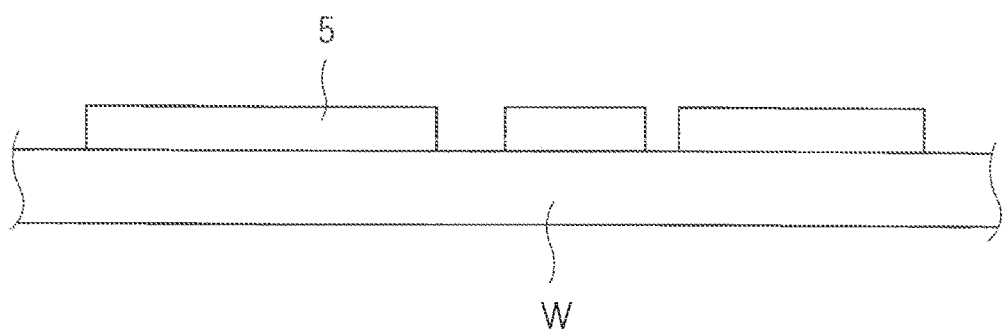
FIG. 9 is a schematic diagram illustrating the surface of the substrate after irradiated with the flash light.

FIG. 9 is a schematic diagram illustrating the surface of the substrate W after irradiation with the flash light. The surface shape of the resist film 5 formed on the surface of the substrate W is flattened and the phenomenon of roughened pattern line width is resolved by irradiating the resist film 5 with flash light that includes a large number of wavelength components in the ultraviolet region for an irradiation time of 0.1 to 1000 milliseconds to increase the temperature of the resist film 5 to a predetermined temperature or higher. Since the temperature of the substrate W itself hardly increases even at the time of irradiation with the flash light, it is possible to prevent device structures or other components already formed on the substrate W from being thermally damaged.

After the irradiation with the flash light ends, the three lift pins 84 move upward to push the substrate W placed on the holding plate 81 upward so that the substrate W is spaced from the holding plate 81. Thereafter, the transfer opening 68 is opened again, and the transfer arm 44a (or 44b) of the transfer robot TR3 enters the chamber 70 from the transfer opening 68 and stops at a position immediately below the substrate W. Then, the lift pins 84 move downward to transfer the substrate W from the lift pins 84 to the transfer arm 44a. The transfer arm 44a of the transfer robot TR3 that has received the substrate W retracts out of the chamber 70, and the substrate W is conveyed out of the chamber 70. This completes the flash heating processing performed in the flash baking unit FLB.

In the first embodiment, the substrate W that has the resist film 5 on the surface and has undergone the pattern exposure processing and the development processing is irradiated with the flash light having a spectral distribution that has a peak in the wavelength range of 200 nm to 300 nm and shows that the relative intensity at a wavelength of 300 nm is 20% or more higher than that at a wavelength of 500 nm. The irradiation with such flash light that includes a large number of wavelength components in the ultraviolet region allows the resist film 5, which passes visible light, to absorb the flash light and increase in temperature, and therefore allows only the surface portion of the resist film 5 to be selectively heated without heating the base substrate W. Accordingly, it is possible to flatten the surface portion of the resist film 5 and to resolve the phenomenon of roughened pattern line width without giving thermal damage to device structures or other components on the substrate W.

The flash lamps FL in the present embodiment emit the flash light having a spectral distribution that has a peak in the wavelength range of 200 nm to 300 nm, and therefore considerable cost is not required for the flash lamps FL themselves. Accordingly, the flash light irradiation using the flash lamps FL in the present embodiment allows only the resist film 5 to be selectively heated while suppressing a considerable increase in cost.

The flash lamps FL in the present embodiment are superior in the stability of irradiation to conventional lamps such as mercury lamps that have been widely used as light sources for emitting ultraviolet rays. Besides, their irradiation conditions such as the number of times of light emission and the light emission time can be easily adjusted by the IGBT 96. Accordingly, it is easy to find optimum conditions for heating the resist film 5 and flattening the surface portion of the resist film 5.

Second Embodiment

Next, a second embodiment according to the present invention will be described. FIG. 10 illustrates a configuration of an essential part of a heat treatment apparatus 100 according to the second embodiment. The heat treatment apparatus 100 of the second embodiment is a flash lamp annealing (FLA) apparatus that irradiates a substrate W on which a dummy gate is formed in the gate-last process with flash light to perform heating processing on the dummy gate. The heat treatment apparatus 100 of the second embodiment has a configuration similar to that of the flash baking unit FLB of the first embodiment. In FIG. 10, constituent elements that are the same as those of the first embodiment (FIG. 5) are given the same reference numerals.

The heat treatment apparatus 100 includes a chamber 70 that houses a substrate W, a holding plate 121 that places and holds the substrate W in the chamber 70, an exhaust part 77 that exhausts gases from the chamber 70, a gas supply part 74 that supplies an inert gas into the chamber 70, and a flash irradiation part 60 that applies flash light to the substrate W. The heat treatment apparatus 100 further includes a controller 90 that controls and causes the aforementioned constituent elements to execute flash heating processing.

The chamber 70 is a housing provided below the flash irradiation part 60 and capable of housing the substrate W. A chamber window 69 is provided with an upper opening of the chamber 70 to close the opening. The space surrounded by the side and bottom walls of the chamber 70 and the chamber window 69 is defined as a heat treatment space 65. The chamber window 69, which constitutes a ceiling of the chamber 70, is a plate-like member made of synthetic quartz and functions as a quartz window that passes the flash light emitted from the flash irradiation part 60 into the heat treatment space 65. Synthetic quartz has high transmittance even in a ultraviolet region at wavelengths of 300 nm or less.

The side wall of the chamber 70 has a transfer opening 68 for conveying a substrate W into and out of the chamber. The transfer opening 68 can be opened and closed by a shutter (not shown). When the transfer opening 68 is open, a transfer robot (not shown) can convey a substrate W into and out of the chamber 70. When the transfer opening 68 is closed, the heat treatment space 65 becomes an enclosed space that prevents the circulation of gases into and out the chamber.

The holding plate 121 is a generally disc-shaped member made of metal (e.g., aluminum) that incorporates a preheating mechanism 122, and places and holds a substrate W in a horizontal position (position at which the direction of the normal to the main surface is along the vertical direction) within the chamber 70. The preheating mechanism 122 may be a heating resistor such as a Nichrome wire. The density of arrangement of the preheating mechanism 122 is at least uniform in a region of the holding plate 121 that opposes the substrates W placed on the holding plate 121. Thus, the preheating mechanism 122 is capable of heating that region uniformly.

The holding plate 121 further includes a temperature sensor 123 configured by a thermocouple. The temperature sensor 123 measures the temperature in the vicinity of the upper surface of the holding plate 121. The result of the measurement by the temperature sensor 123 is transmitted to the controller 90. The controller 90 controls the preheating mechanism 122 such that the temperature of the holding plate 121 measured by the temperature sensor 123 is kept at a preset preheating temperature. That is, the controller 90 performs feedback control of the temperature of the holding plate 121, based on the result of the measurement by the temperature sensor 123. Note that a plurality of temperature sensors 123 may be provided in the region of the holding plate 121 that opposes the substrate W placed on the holding plate 121.

The upper surface of the holding plate 121 has a plurality of (three or more) proximity balls (not shown) arranged thereon. The proximity balls are made of a material such as alumina ($Al_2O_3$) and arranged such that the upper ends of the proximity balls protrude by a slight amount from the upper surface of the holding plate 121. Thus, a slight gap, so-called a proximity gap, is formed between the rear surface of the substrate W and the upper surface of the holding plate 121 when the substrate W is supported by the plurality of proximity balls. Alternatively, a susceptor made of quartz may be provided on the upper surface of the holding plate 121 to support the substrate W via the susceptor.

The holding plate 121 has a plurality of (three, in the present embodiment) lift pins 84 that appear from the upper surface of the holding plate 121. The height positions of the upper ends of the three lift pins 84 are in the same horizontal plane. The three lift pins 84 are collectively moved up and down in the vertical direction by an air cylinder 85. Each lift pin 84 moves up and down along the inside of a through hole that vertically passes through the holding plate 121. When the air cylinder 85 moves the three lift pins 84 upward, the end of each lift pin 84 protrudes from the upper surface of the holding plate 121. When the air cylinder 85 moves the three lift pins 84 downward, the end of each lift pin 84 enters the inside of the through hole of the holding plate 121.

The gas supply part 74 supplies a nitrogen gas ($N_2$) as an inert gas into the chamber 70. The gas supply part 74 includes a nitrogen supply source 75 and a valve 76 and opens the valve 76 to supply the nitrogen gas into the heat treatment space 65 of the chamber 70. The nitrogen supply source 75 may be configured by, for example, a tank and a feeding pump provided in the heat treatment apparatus 100, or may use utility in a factory where the heat treatment apparatus 100 is installed.

The exhaust part 77 includes an exhaust device 78 and a valve 79 and opens the valve 79 to exhaust an atmosphere in the chamber 70. The exhaust device 78 may be a vacuum pump or an exhaust utility in a factory where the heat treatment apparatus 100 is installed. The atmosphere in the chamber 70 can be reduced to a vacuum atmosphere if a vacuum pump is adopted as the exhaust device 78 and the atmosphere in the heat treatment space 65, which is an enclosed space, is exhausted without supplying any gas from the gas supply part 74. Even if the exhaust device 78 is not a vacuum pump, the atmosphere in the chamber 70 can be reduced to an atmosphere lower than the atmospheric pressure by exhausting the atmosphere without supplying any gas from the gas supply part 74.

The flash irradiation part 60 is provided above the chamber 70. The flash irradiation part 60 includes a light source that includes a plurality of flash lamps FL, and a reflector 62 provided to cover the top of the light source. The flash irradiation part 60 irradiates the substrate W held by the holding plate 121 in the chamber 10 with the flash light emitted from the flash lamps FL through the chamber window 69 made of quartz.

The plurality of flash lamps FL are long cylindrical rod-shaped lamps and arrayed in a plane so that their lengths are parallel to one another along the major surface of the substrate W held by the holding plate 121 (i.e., in the horizontal direction). Thus, the plane formed by the array of the flash lamps FL is also a horizontal plane.

The drive circuit of each flash lamp FL is similar to that of the first embodiment (FIG. 6). The flash lamp FL includes a rod-shaped glass tube (discharge tube) 92 that is filled with a xenon gas and has an anode and a cathode at opposite ends, and a trigger electrode 91 additionally provided on the outer peripheral surface of the glass tube 92. A predetermined voltage is applied from a power supply unit 95 to a capacitor 93, and the capacitor 93 is charged with the amount of charge corresponding to the applied voltage (charging voltage). Also, a high voltage is applied from a trigger circuit 97 to the trigger electrode 91. The timing at which the trigger circuit 97 applies a voltage to the trigger electrode 91 is controlled by the controller 90.

Even if the IGBT 96 is turned on with the capacitor 93 storing charge and a high voltage is applied across the electrodes in the glass tube 92, no electricity will flow through the glass tube 92 in the normal state because the xenon gas is electrically an insulator. However, if an electrical breakdown occurs as a result of the trigger circuit 97 applying a high voltage to the trigger electrode 91, discharge that occurs across the electrodes will produce an instantaneous current flow in the glass tube 92, and light will be emitted by excitation of xenon atoms or molecules at that time.

The flash lamps FL of the second embodiment also emit flash light that includes a relatively large number of wavelength components in the ultraviolet region. The spectral distribution of the flash light emitted from the flash lamps FL of the second embodiment is similar to that of the first embodiment illustrated in FIG. 7. As illustrated in FIG. 7, the spectral distribution of the flash light emitted from the flash lamps FL of the second embodiment has a peak in the wavelength range of 200 nm to 300 nm. The spectral distribution of the flash light emitted from the flash lamps FL also shows that the relative intensity at a wavelength of 300 nm is 20% or more higher than the relative intensity at a wavelength of 500 nm. The spectral distribution as illustrated in FIG. 7 can be obtained by adjusting the components or gas pressure of the xenon gas encapsulated in the glass tube 92. Preferably, the glass tube 92 is also made of synthetic quartz having high transmittance in an ultraviolet region at wavelengths of 300 nm or less.

The reflector 62 is provided above the plurality of flash lamps FL to cover all of the flash lamps FL. A basic function of the reflector 62 is to reflect the flash light emitted from the plurality of flash lamps FL toward the heat treatment space 65. The reflector 62 is made of an aluminum alloy plate and has a surface (surface facing the flash lamps FL) roughened by blasting.

The controller 90 controls the aforementioned various operating mechanisms provided in the heat treatment apparatus 100. The hardware configuration of the controller 90 is similar to that of a generic computer. That is, the controller 90 includes, for example, a CPU that is a circuit for performing various types of computation processing, a ROM that is a read-only memory for storing basic programs, a RAM that is a readable/writable memory for storing various types of information, and a magnetic disk for storing control applications, data, and so on. The processing performed in the heat treatment apparatus 100 proceeds as a result of the CPU of the controller 90 executing a predetermined processing program.

Figure 13:
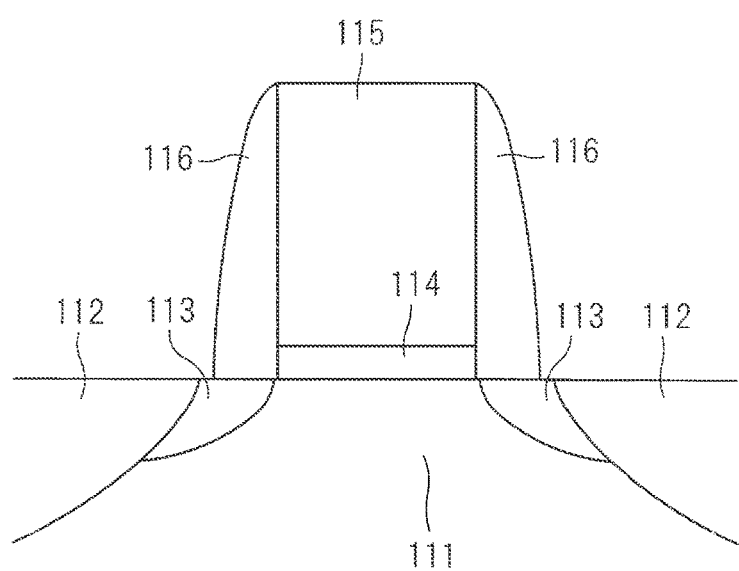
FIG. 13 illustrates a structure of the dummy gate and its surroundings.

Next is a description of the procedure of processing performed on substrates by the heat treatment apparatus 100 having the aforementioned configuration. Here, a procedure of processing performed on a substrate W in the gate-last process will be described briefly, and in particular, heating processing performed in the heat treatment apparatus 100 will be described in detail. FIG. 11 is a flowchart illustrating an overall procedure of processing performed on a substrate W in the gate-last process. The procedure of processing performed in the gate-last process will be briefly described with reference to the schematic diagram in FIG. 13.

First, a dummy gate 115 of polysilicon (polycrystalline silicon) is formed on a substrate W (step S1). The substrate W may be a silicon semiconductor wafer. A silicon oxide film 114 (film of silicon dioxide: $SiO_2$) is formed on a base material 111 of single crystalline silicon that constitutes the substrate W, and the dummy gate 115 of polysilicon is formed on the silicon oxide film 14. Then, sidewalls 116 of SiN are formed on both sides of the dummy gate 115 (step S2).

Next, ions such as boron (B), arsenic (As), and phosphorus (P) are implanted into the base material 111 of the substrate W (step S3). The ion implantation is performed on a source/drain region 112 and an extension region 113 of the base material 111. The extension region 113 is a portion that electrically connects the source/drain region 112 and a channel.

Thereafter, annealing is performed to activate the implanted ions (step S4). The annealing for activating ions is preferably performed in a time as short as possible in order to suppress diffusion of ions. It is optimal to use a flash annealing device for the annealing, but the annealing may be performed by rapid heating using halogen lamps. In the gate-last process, since the annealing for activating ions is performed in the presence of the dummy gate, instead of a high-dielectric-constant gate insulation film, the occurrence of defects due to heating of the high-dielectric-constant gate insulation film can be prevented.

After the annealing ends, processing such as forming contacts is performed as necessary (step S5). Note that constituent elements such as contacts are now shown in FIG.

Figure 12:
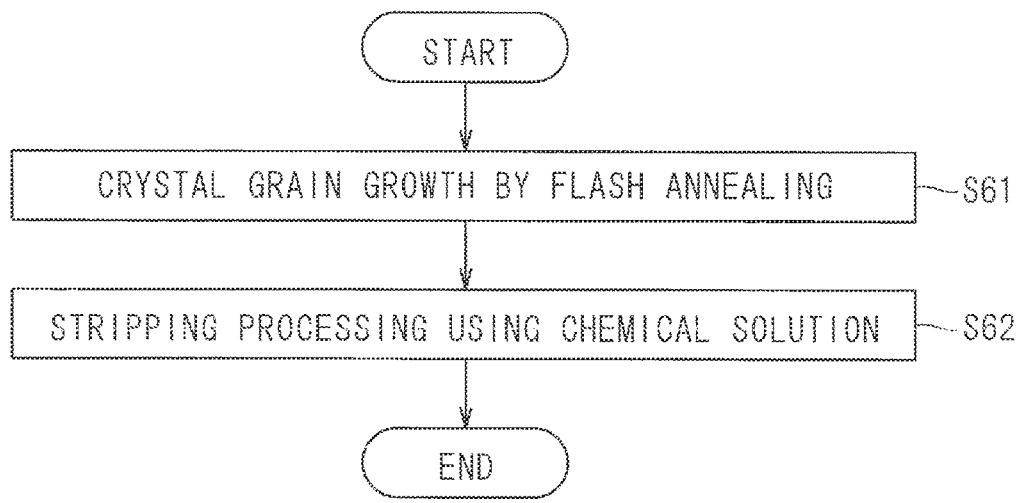
FIG. 12 is a flowchart illustrating a procedure of processing for stripping a dummy gate according to the present invention.

13. Then, processing for stripping the dummy gate 115 is performed (step S6). FIG. 12 is a flowchart illustrating a procedure of the processing for stripping the dummy gate 115 according to the present invention.

In the stripping processing, grain growth of polysilicon crystal grains of the dummy gate 115 is caused by flash annealing (flash heating) (step S61). This flash annealing is performed by the heat treatment apparatus 100. In the heat treatment apparatus 100, a shutter (not shown) is opened to open the transfer opening 68, and a substrate W that has undergone the aforementioned ion activation processing is conveyed into the chamber 70 by a transfer robot outside the apparatus. The dummy gate 115 is formed on the surface of the conveyed substrate W.

FIG. 14 illustrates crystal grains of the dummy gate 115 before flash annealing. As illustrated in FIG. 14, the crystal grain size of polysilicon of the dummy gate 115 is relatively small before the heat treatment apparatus 100 performs flash annealing. The transfer robot that holds the substrate W on which the dummy gate 115 of polysilicon having the above structure is formed enters the chamber 70 from the transfer opening 68 and stops immediately above the holding plate 121. Then, the three lift pins 84 move upward to receive the substrate W from the transfer robot. Thereafter, the transfer robot retracts out of the chamber 70, and the transfer opening 68 is closed so that the heat treatment space 65 in the chamber 70 becomes an enclosed space.

After the transfer robot has retracted, the three lift pins 84 supporting the substrate W move downward and enter the inside of the through holes of the holding plate 121. In the process of moving downward, the lift pins 84 transfers the substrate W to the upper surface of the holding plate 121, and the substrate W is placed and held in a horizontal position on the upper surface of the holding plate 121.

The holding plate 121 is kept in advance at a predetermined preheating temperature by the preheating mechanism 122. By placing the substrate W on the holding plate 121, the entire substrate W is preheated to the predetermined preheating temperature. Then, after a predetermined period of time has elapsed since the substrate W is held by the holding plate 121, flash light emitted from the flash lamps FL of the flash irradiation part 60 toward the surface of the substrate W held by the holding plate 121 under the control of the controller 90. At this time, the atmosphere in the chamber 70 may have been replaced by a nitrogen atmosphere by the gas supply part 74 and the exhaust part 77.

For the application of flash light from the flash lamps FL, the capacitor 93 is electrically charged in advance by the power supply part 95. Then, with the capacitor 93 storing the charge, the pulse generator 98 of the controller 90 outputs a pulse signal to the IGBT 96 to drive the IGBT 96 between ON and OFF states.

The waveform of the pulse signal can be defined by inputting, from the input part 67, a set of instructions that sequentially set a time corresponding to the pulse width (ON time) and a time corresponding to the pulse interval (OFF time) as parameters. When an operator inputs such a set of instructions from the input part 67 to the controller 90, the waveform setting part 99 of the controller 90 sets a pulse waveform that repeats ON and OFF in accordance with the set of instructions. Then, the pulse generator 98 outputs a pulse signal in accordance with the pulse waveform, which is set by the waveform setting part 99. As a result, a pulse signal that repeats ON and OFF is applied to the gate of the IGBT 96, and the ON-OFF driving of the IGBT 96 is controlled. More specifically, the IGBT 96 is in the ON state when the pulse signal inputted to the gate of the IGBT 96 is ON, whereas the IGBT 96 is in the OFF state when the pulse signal is OFF.

In synchronization with the timing at which the pulse signal output from the pulse generator 98 becomes ON, the controller 90 controls the trigger circuit 97 to apply a high voltage (trigger voltage) to the trigger electrode 91. That is, a pulse signal is input to the gate of the IGBT 96 while the capacitor 93 stores the charge, and a high voltage is applied to the trigger electrode 91 in synchronization with the timing at which the pulse signal becomes ON. Thus, when the pulse signal is ON, current always flows across the electrodes in the glass tube 92, and light is emitted by excitation of xenon atoms or molecules at that time.

In this way, the IGBT 96 serving as a switching device is connected to the circuit, and a pulse signal that repeats ON and OFF is output to the gate of the IGBT 96. This allows the IGBT 96 to intermittently continue the supply of charge from the capacitor 93 to the flash lamps FL and to thereby control the amount of current flowing to the flash lamps FL. As a result, the light emission from the flash lamps FL is so-called chopper-controlled, the charge stored in the capacitor 93 is divided for consumption, and the flash lamps FL repeatedly blink within an extremely short period of time. However, the emission output does not become completely zero even during the repeated blinking of the flash lamps FL because the next pulse will be applied to the gate of the IGBT 96 and the current value will increase again before the value of the current flowing to the flash lamps FL becomes completely zero. Accordingly, the flash lamps FL continue to emit light while a pulse signal at a relatively short interval is output to the IGBT 96.

The waveform of the pulse signal may be arbitrarily set by defining the time corresponding to the pulse width and the time corresponding to the pulse interval. Thus, the ON-OFF drive of the IGBT 96 can be controlled arbitrarily, and the light emission time of the flash lamps FL can be adjusted within the range of 0.1 to 1000 milliseconds by appropriately setting the waveform of the pulse signal. Part of the flash light emitted from the flash lamps FL travels directly into the chamber 70, and part of the flash light is once reflected by the reflector 62 and then travels into the chamber 70. Thus, the surface of the substrate W is flash heated by irradiation with such flash light.

Here, as illustrated in FIG. 7, the spectral distribution of the flash light emitted from the flash lamps FL in the present embodiment has a peak in the wavelength range of 200 nm to 300 nm and shows that the relative intensity at a wavelength of 300 nm is 20% or more higher than the relative intensity at a wavelength of 500 nm. That is, the flash light emitted from the flash lamps FL includes a relatively large number of wavelength components in the ultraviolet region.

The chamber window 69, which functions as a quartz window that passes the flash light, is made of synthetic quartz having high transmittance even in an ultraviolet region at wavelengths of 300 nm or less. Thus, almost all components in the ultraviolet region, included in the flash light emitted from the flash lamps FL, will pass through the chamber window 69, and the surface of the substrate W held by the holding plate 121 in the chamber 70 is irradiated with the flash light having a spectral distribution that has a peak in the wavelength range of 200 nm to 300 nm and shows that the relative intensity at a wavelength of 300 nm is 20% or more higher than the relative intensity at a wavelength of 500 nm.

Polysilicon, which constitutes the dummy gate 115, exhibits a higher absorption coefficient for shorter-wavelength light. That is, polysilicon has a higher absorption coefficient for ultraviolet light than for infrared light or visible light. Although conventionally used typical flash lamps emit flash light that primarily includes visible light components, in the present embodiment the surface of the substrate W is irradiated with flash light that includes a large number of wavelength components in the ultraviolet region. Thus, the flash light is more efficiently absorbed in the dummy gate 115 of polysilicon than in conventional cases, and accordingly the dummy gate 115 is heated efficiently.

Figure 15:
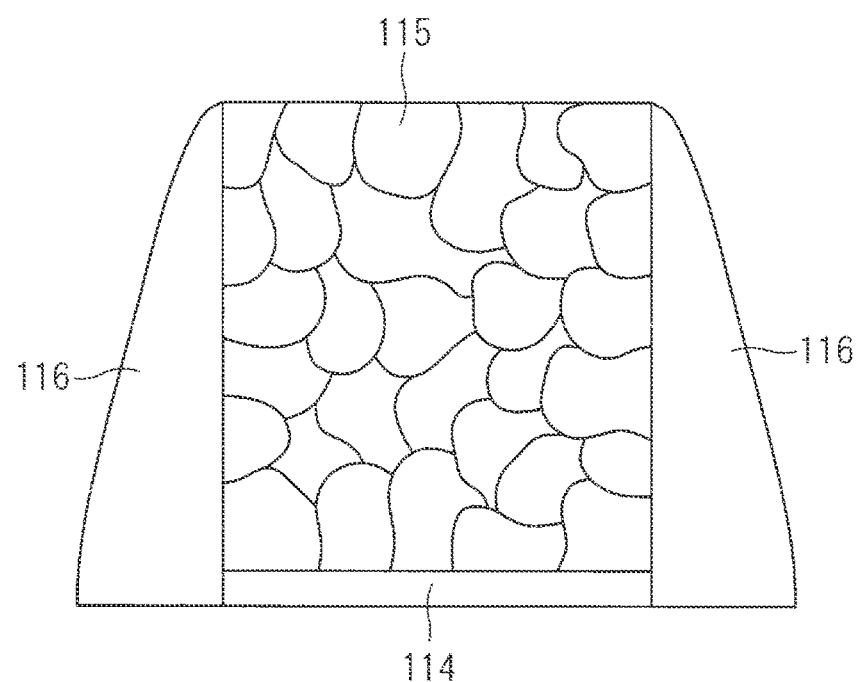
FIG. 15 illustrates crystal grains in the dummy gate after flash annealing.

The grain growth of silicon crystal gains is caused by heating the dummy gate 115 of polysilicon and increasing the temperature of the dummy gate 115. FIG. 15 illustrates crystal grains of the dummy gate 115 after flash annealing. A comparison of FIGS. 14 and 15 clearly shows that the grain growth of silicon crystal grains of polysilicon is caused by irradiating the substrate W with the flash light including a large number of wavelength components in the ultraviolet region and flash-heating the dummy gate 115.

On the other hand, the flash-light emission time is within a range of 0.1 milliseconds to 1 second. Thus, there is no concern that the source/drain region 112 and the extension region 113 other than the dummy gate 115 are also heated for more than several seconds. This prevents diffusion of ions implanted into the source/drain region 112 or other regions.

Moreover, the depth to which the flash light reaches is relatively shallow because the flash light emitted in the present embodiment includes a large number of wavelength components in the ultraviolet region. Thus, the flash light will hardly have adverse effects on depth portions such as the source/drain region 112.

When the irradiation with the flash light ends, the surface temperature of the substrate W rapidly drops. Then, the three lift pins 84 move upward to push the substrate W placed on the holding plate 121 upward and space the substrate W from the holding plate 121. Separating the substrate W from the holding plate 121 causes a further temperature drop of the substrate W even from the preheating temperature. Thereafter, the transfer opening 68 is opened again, and the transfer robot enters the chamber 70 from the transfer opening 68 and stops immediately below the substrate W. Then, the lift pins 84 move downward to transfer the substrate W from the lift pins 84 to the transfer robot. The transfer robot that has received the substrate W then retracts out of the chamber 70, and the substrate W is conveyed out of the chamber 70. This completes the flash annealing performed in the heat treatment apparatus 100.

After the flash heating processing ends, the processing for stripping the dummy gate 115 by a wet process using a chemical solution is performed (step S62). The stripping processing by the wet process is implemented by another apparatus different from the heat treatment apparatus 100, and this apparatus may be a batch-type processing apparatus for processing a plurality of substrates W collectively, or may be a single-wafer processing apparatus for processing substrates W one at a time. In either case, the dummy gate 115 is stripped by supplying a chemical solution to the surface of a substrate W on which the silicon crystal grains of the dummy gate 115 have been grown by flash heating. The chemical solution used in the stripping processing may be aqueous ammonia or a hydrofluoric acid.

The supply of the chemical solution to the surface of the substrate W causes corrosion (etching) of polysilicon of the dummy gate 115. At this time, if the flash annealing in step S61 is not performed and the chemical solution is supplied to the dummy gate 115 in which the grain size of silicon crystal grains is relatively small as illustrated in FIG. 14, the dummy gate 115 may not be etched sufficiently and part of polysilicon may remain on the substrate W. In particular, lower corner portions of the dummy gate 115 are apt to remain and make defects.

In the second embodiment, the chemical solution is supplied to the dummy gate 115 (FIG. 15) in which the grain size of polysilicon crystal grains is increased by the flash heating processing. In this case, the grain boundaries of silicon crystal grains are preferentially subject to corrosion, and in particular, the interfaces between the sidewalls 116 of SiN and the dummy gate 115 are remarkably subjected to corrosion. As a result, the dummy gate 115 is cleanly stripped from the substrate W with high precision without any remaining of polysilicon.

Figure 16:
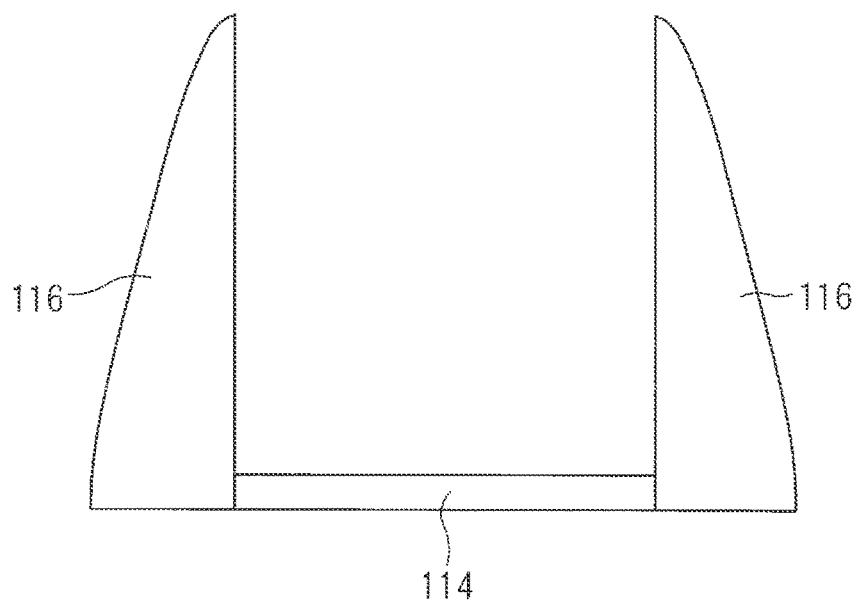
FIG. 16 illustrates a state in which the dummy gate of polysilicon has been stripped.

FIG. 16 illustrates a state in which the dummy gate 115 of polysilicon is stripped. The dummy gate 115 is removed with high precision without any remaining of polysilicon on the inner wall surfaces of the sidewalls 116 or other portions.

Referring back to FIG. 11, after the processing for stripping the dummy gate 115 ends, a high-dielectric-constant gate insulation film (High-k gate insulation film) is deposited on the silicon oxide film 114 (step S7). Examples of the high-dielectric-constant gate insulation film include oxides such as hafnium (HO, zirconium (Zr), and titanium (Ti). The high-dielectric-constant gate insulation film is deposited into an extremely thin layer by, for example, atomic layer deposition (ALD). Then, a metal gate electrode is formed on the high-dielectric-constant gate insulation film in the last step. The material for the metal gate electrode may be titanium or titanium-containing nitride.

In the second embodiment, the dummy gate 115 of polysilicon formed in the gate-last process is irradiated with the flash light that includes a relatively large number of wavelength components in the ultraviolet region. More specifically, the dummy gate 115 of polysilicon is irradiated with the flash light having a spectral distribution that has a peak in the wavelength range of 200 nm to 300 nm and shows that the relative intensity at a wavelength of 300 nm is 20% or more higher than the relative intensity at a wavelength of 500 nm.

The irradiation with such flash light that includes a large number of wavelength components in the ultraviolet region allows the dummy gate 115 of polysilicon, which has high absorption coefficient for short-wavelength light, to efficiently absorb the flash light and increase in temperature, and accordingly causes the grain growth of silicon crystal grains. When the grain size of silicon crystal grains increases as a result of the grain growth, the interfaces between the sidewalls 116 and the dummy gate 115 are preferentially subject to corrosion in the subsequent stripping step using the chemical solution. As a result, the dummy gate 115 can be removed with high precision.

If the light emission time is short (e.g., 1 seconds or less) and the flash light includes a large number of wavelength components in the ultraviolet region, there is no concern that the other regions such as the source/drain region 112 are heated for more move than several seconds. This prevents unnecessary diffusion of implanted ions.

Variations

While the above has been a description of embodiments of the present invention, various modifications other than those described above are possible without departing from the scope of the present invention. For example, while the light emission from the flash lamps FL is controlled by the IGBT 96 in the above-described embodiments, the IGBT 96 is not always an essential element. Even in the absence of the IGBT 96, the irradiation conditions of the flash lamps FL can be adjusted using the voltage applied to the capacitor 93 or the inductance of the coil 94.

While the substrates W that have undergone the hard baking processing are irradiated with the flash light in the first embodiment, the hard baking processing is not always essential processing. Alternatively, the flash heating performed in the flash baking unit FLB may involve hard baking processing.

While the dummy gate 115 is made of polysilicon in the second embodiment, the present invention is not limited to this example, and the dummy gate 115 may be made of amorphous silicon. An effect similar to that of the aforementioned embodiment can be achieved by irradiating the dummy gate 115 of amorphous silicon with flash light that includes a relatively large number of wavelength components in the ultraviolet region and thereby causing crystallization and grain growth of amorphous silicon.

Films to be heated by the heat treatment technique according to the present invention are not limited to the resist film 5, and may be films that include other carbon atoms (e.g., interlayer insulation film).

While the substrates W to be processed by the heat treatment technique according to the present invention are not limited to semiconductor wafers, and may be glass substrates for liquid crystal displays or substrates for solar cells.

REFERENCE SIGNS LIST

1 Substrate processing apparatus
5 Resist film
10 Indexer block
20 Barking block
30 Resist coating block
40 Development block
50 Interface block
60 Flash irradiation part
65 Heat treatment space
69 Chamber window
70 Chamber
81, 121 Holding plate
90 Controller
96 IGBT
100 Heat treatment apparatus
112 Source and drain regions
113 Extension region
114 Silicon oxide film
115 Dummy gate
116 Sidewall
FL Flash lamp
FLB Flash baking unit
W Substrate

The invention claimed is:

1. A heat treatment method for applying flash light to a substrate on which a dummy gate of polycrystalline silicon is formed, to heat the dummy gate, the method comprising:

a flash irradiation step of irradiating a surface of said substrate with flash light having a light emission time within the range of 0.1 to 1,000 milliseconds and having a spectral distribution that has a peak in a wavelength range of 200 nm to 300 nm to heat said dummy gate while preventing diffusion of ions implanted into a surface region of said substrate other than said dummy gate, to cause grain growth of silicon crystal grains of said dummy gate; and a stripping step of stripping said dummy gate by supplying a chemical solution to the surface of said substrate.

2. A heat treatment method for applying flash light to a substrate on which a dummy gate of polycrystalline silicon is formed, to heat the dummy gate, the method comprising:

a flash irradiation step of irradiating a surface of said substrate with flash light having a light emission time within the range of 0.1 to 1,000 milliseconds and having a spectral distribution showing that a relative intensity at a wavelength of 300 nm is 20% or more higher than a relative intensity at a wavelength of 500 nm to heat said dummy gate while preventing diffusion of ions implanted into a surface region of said substrate other than said dummy gate, to cause grain growth of silicon crystal grains of said dummy gate; and a stripping step of stripping said dummy gate by supplying a chemical solution to the surface of said substrate.

3. A heat treatment method for applying flash light to a substrate having a surface on which a resist film is formed and that has undergone exposure processing and development processing, to heat the resist film, the method comprising:

a housing step of housing said substrate that has undergone exposure processing in a chamber; and a flash irradiation step of irradiating the surface of said substrate housed in said chamber with flash light having a light emission time within the range of 0.1 to 1,000 milliseconds and having a spectral distribution that has a peak in a wavelength range of 200 nm to 300 nm to selectively heat only said resist film without heating said substrate to flatten a surface portion of said resist film.

4. A heat treatment method for applying flash light to a substrate having a surface on which a resist film is formed and that has undergone exposure processing and development processing, to heat the resist film, the method comprising:

a housing step of housing said substrate that has undergone exposure processing in a chamber; and a flash irradiation step of irradiating the surface of said substrate housed in said chamber with flash light having a light emission time within the range of 0.1 to 1,000 milliseconds and having a spectral distribution showing that a relative intensity at a wavelength of 300 nm is 20% or more higher than a relative intensity at a wavelength of 500 nm to selectively heat only said resist film without heating said substrate to flatten a surface portion of said resist film.

* * * * *